(12) United States Patent
Baek et al.

(10) Patent No.: US 11,409,172 B2
(45) Date of Patent: Aug. 9, 2022

(54) DISPLAY DEVICE

(71) Applicant: Samsung Display Co., LTD., Yongin-si (KR)

(72) Inventors: Gyungmin Baek, Yongin-si (KR); Sangwon Shin, Yongin-si (KR); Hyuneok Shin, Gwacheon-si (KR); Juhyun Lee, Seongnam-si (KR); Hongsick Park, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 259 days.

(21) Appl. No.: 16/881,722

(22) Filed: May 22, 2020

(65) Prior Publication Data

US 2021/0018805 A1  Jan. 21, 2021

(30) Foreign Application Priority Data

Jul. 17, 2019 (KR) .................. 10-2019-0086560

(51) Int. Cl.
| | |
|---|---|
| *H01L 27/12* | (2006.01) |
| *G02F 1/1362* | (2006.01) |
| *G02F 1/1368* | (2006.01) |
| *H01L 27/32* | (2006.01) |
| *H01L 51/52* | (2006.01) |
| *H01L 51/50* | (2006.01) |

(52) U.S. Cl.
CPC ...... *G02F 1/136286* (2013.01); *G02F 1/1368* (2013.01); *G02F 1/13629* (2021.01); *G02F 1/136295* (2021.01); *H01L 27/124* (2013.01); *H01L 27/3262* (2013.01); *H01L 27/3276* (2013.01); *H01L 51/502* (2013.01); *H01L 51/5253* (2013.01); *H01L 51/5281* (2013.01); *H01L 2251/303* (2013.01)

(58) Field of Classification Search
CPC . H01L 27/124; H01L 27/3276; H01L 27/328; H01L 51/5281; H01L 51/5284; G02F 1/136286; G02F 1/13629; G02F 1/136295
See application file for complete search history.

(56) References Cited

U.S. PATENT DOCUMENTS

| | | | |
|---|---|---|---|
| 5,066,615 A | 11/1991 | Brady et al. | |
| 5,091,244 A | 2/1992 | Biornard | |
| 2008/0029767 A1* | 2/2008 | Nagata | ............... H01L 29/41733 257/E29.147 |
| 2013/0256638 A1* | 10/2013 | Uesugi | ................ H01L 51/0023 438/34 |

(Continued)

FOREIGN PATENT DOCUMENTS

| | | |
|---|---|---|
| KR | 10-1103041 | 1/2012 |
| KR | 10-2014-0107028 | 9/2014 |

*Primary Examiner* — Bryan R Junge
(74) *Attorney, Agent, or Firm* — Kile Park Reed & Houtteman PLLC

(57) ABSTRACT

A display device includes a base layer, a display element disposed on the base layer, and a signal line disposed on the base layer and electrically connected to the display element. The signal line includes a conductive layer and a capping layer. The capping layer is disposed on the conductive layer and includes vanadium nitride (VN) and zinc oxide (ZnO). The display device may reduce the reflection of an external light source, thereby having improved visibility.

20 Claims, 20 Drawing Sheets

(56) References Cited

U.S. PATENT DOCUMENTS

2016/0043226 A1\*  2/2016  Yoon .................... H01L 27/124
                                                      349/47
2019/0004616 A1   1/2019  Baek et al.

\* cited by examiner

DISPLAY DEVICE

CROSS-REFERENCE TO RELATED APPLICATION(S)

This application claims priority to and benefits of Korean Patent Application No. 10-2019-0086560 under 35 U.S.C. § 119, filed on Jul. 17, 2019, in the Korean Intellectual Property Office, the entire contents of which are incorporated herein by reference.

BACKGROUND

The disclosure relates to a display device, and in particular, to a display device having a low optical reflectance to an external light.

A display device includes signal lines, which are used to display an image or to sense an external signal, and electronic devices, which are connected to signal lines. The signal lines and the electronic devices include conductive patterns. Since the conductive patterns include a highly reflective metal, they reflect an external light, and this allows a user to recognize the conductive patterns. Where there is reflection of the external light and the signal lines or the electronic devices are recognized by the user, visibility of an image displayed on the display device may be deteriorated.

SUMMARY

An embodiment provides a display device with improved visibility. The display device includes a signal line, which has low reflectance to an external light, and this allows the display device to have an improved visibility property.

According to an embodiment, a display device may include a base layer, a display element, and a signal line. The display element may be disposed on the base layer. The signal line may be disposed on the base layer and may be electrically connected to the display element. The signal line may include a conductive layer and a capping layer. The capping layer may be disposed on the conductive layer and may include vanadium nitride (VN) and zinc oxide (ZnO).

In an embodiment, the capping layer may further include aluminum oxide ($Al_2O_3$).

In an embodiment, in the capping layer, a content of the vanadium nitride in the may range from about 25 at % to about 80 at %, a content of the zinc oxide may range from about 20 at % to about 70 at %, and a content of the aluminum oxide may range from about 3 at % to about 10 at %.

In an embodiment, reflectance of the capping layer may be lower than reflectance of the conductive layer.

In an embodiment, the capping layer may be directly disposed on the conductive layer.

In an embodiment, a mean reflectance of the signal line to visible light may be equal to or less than about 20%.

In an embodiment, the signal line may further include an intermediate layer, which may be disposed between the conductive layer and the capping layer. The intermediate layer may have a refractive index between a refractive index of the conductive layer and a refractive index of the capping layer.

In an embodiment, the intermediate layer may include at least one selected from the group consisting of silicon oxide, silicon nitride, silicon oxynitride, titanium oxide, and aluminum oxide.

In an embodiment, a thickness of the capping layer may range from about 200 Å to about 1000 Å.

In an embodiment, the display device may further include a thin film transistor, which may be disposed on the base layer. The display element may be electrically connected to the thin film transistor. The signal line may include a first signal line and a second signal line. The first signal line may be disposed on the base layer. The second signal line may cross the first signal line and may be electrically disconnected from the first signal line.

In an embodiment, the thin film transistor may include a semiconductor pattern disposed on the base layer, a control electrode, an input electrode, and an output electrode. The control electrode may overlap the semiconductor pattern when viewed in a plan view. The control electrode and the first signal line may be disposed on the same layer. The input electrode and the output electrode may be electrically connected to the semiconductor pattern. The input electrode, the output electrode, and the second signal line may be disposed on the same layer. Each of the control electrode, the input electrode, and the output electrode may include the conductive layer, and the capping layer, which may be disposed on the conductive layer.

In an embodiment, the display element may be a liquid crystal display element.

In an embodiment, the display device may further include an input sensing unit, which may be disposed on the display element. The input sensing unit may include an input sensing electrode and an input sensing line. Each of the input sensing electrode and the input sensing line may include the conductive layer, and the capping layer, which may be disposed on the conductive layer and may include vanadium nitride (VN) and zinc oxide (ZnO).

In an embodiment, the display element may include an organic light emitting display element containing an organic light emitting material or a quantum dot light emitting material.

In an embodiment, the conductive layer may include copper.

According to an embodiment, a display device may include a first signal line and a second signal line. The first signal line and the second signal line may be spaced apart from each other. At least one of the first signal line and the second signal line may include a conductive layer and a capping layer. The capping layer may be disposed on the conductive layer and may include vanadium nitride (VN) and zinc oxide (ZnO).

In an embodiment, the capping layer may further include aluminum oxide ($Al_2O_3$).

In an embodiment, in the capping layer, a content of the vanadium nitride may range from about 25 at % to about 80 at %, a content of the zinc oxide may range from about 20 at % to about 70 at %, and a content of the aluminum oxide may range from about 3 at % to about 10 at %.

In an embodiment, a thickness of the capping layer may range from about 200 Å to about 1500 Å.

In an embodiment, a mean reflectance of the capping layer to visible light may be equal to or less than about 25%.

BRIEF DESCRIPTION OF THE DRAWINGS

Embodiments will be more clearly understood from the following descriptions of the drawings. The drawings represent non-limiting embodiments as described herein.

Figure 1:
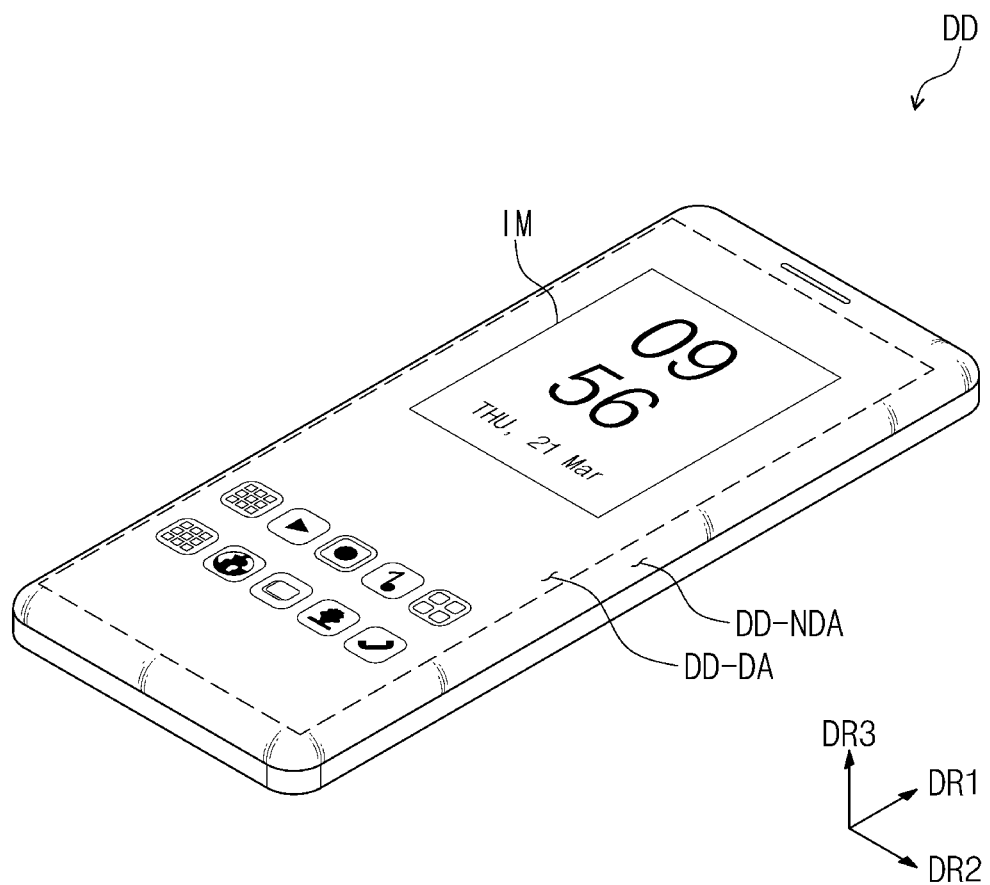
FIG. 1 is a perspective view illustrating a display device according to an embodiment.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by the embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF THE EMBODIMENTS

Embodiments will now be described more fully with reference to the accompanying drawings, in which embodiments are shown. Embodiments may, however, be embodied in many different forms and should not be construed as being limited to the embodiments set forth herein. These embodiments are provided so that this disclosure will be thorough and complete, and will fully convey the concept to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

The phrase "at least one of" is intended to include the meaning of "at least one selected from the group of" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

The term "and/or" includes any and all combinations of one or more of the associated listed items. The terms "and" and "or" may be used in the conjunctive or disjunctive sense and may be understood to be equivalent to "and/or".

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±20%, 10%, or 5% of the stated value.

Embodiments are described herein with reference to schematic cross-sectional illustrations which show embodiments and intermediate structures thereof. Variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which the embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a perspective view illustrating a display device DD according to an embodiment.

FIG. 1 illustrates an example, in which a portable terminal with four curved edges is provided as the display device DD. However, the invention is not limited to this example, and in an embodiment, one of flat, curved, bendable, rollable, foldable, and stretchable display devices may be provided as the display device DD. Although not shown, the display device DD may be used for large-sized electronic devices (e.g., television sets and outdoor billboards) or small- or medium-sized electronic devices (e.g., personal computers, notebook computers, personal digital assistants, car navigation systems, game machines, portable electronic devices, wristwatch-type electronic devices, and cameras). However, it should be understood that these are merely embodiments of the invention, and that other electronic devices may be used, unless they depart from the spirit of the invention.

The display device DD may include a display surface that is sectioned into regions. The display device DD may include a display region DD-DA, on which images IM are displayed, and a non-display region DD-NDA, which is adjacent to the display region DD-DA. In FIG. 1, a clock widget is illustrated as an example of the image IM. The non-display region DD-NDA may surround the display region DD-DA.

In the embodiments, a front or top surface and a rear or bottom surface of each element or member may be defined, based on a display direction of the image IM. The front and rear surfaces may be two opposite surfaces facing each other in a third direction DR3 and a direction normal to each of the front and rear surfaces may be parallel to the third direction DR3. Directions indicated by first to third directions DR1, DR2, and DR3 may be a relative concept, and in certain embodiments, they may be used to indicate other directions. Hereinafter, first to third directions may be directions indicated by the first to third directions DR1, DR2, and DR3, respectively, and will be referenced with the same reference numbers. In the specification, the expression "when viewed in a plan view" means that the structure under consideration is observed in the third direction DR3 (i.e., the normal direction).

In an embodiment, the display device DD may include signal lines SL (e.g., see FIG. 2A), which are used to transmit signals for various purposes, such as the displaying of images or the sensing of external signals. Hereinafter, the signal line SL according to an embodiment (e.g., see FIG. 2A) will be described in more detail below.

Figure 2A:
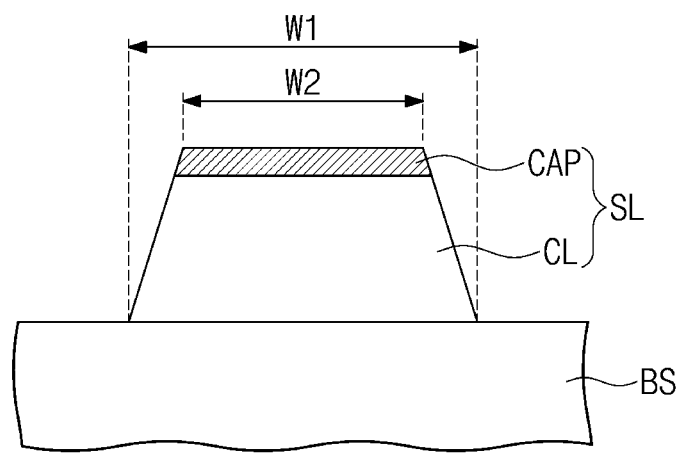
FIGS. 2A and 2B are schematic sectional views illustrating a signal line according to an embodiment.
Figure 2B:
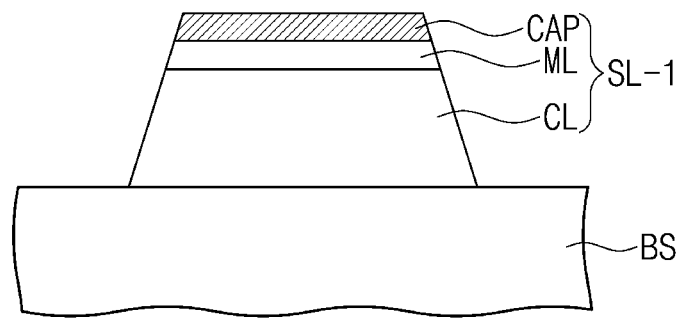

FIGS. 2A and 2B are schematic sectional views illustrating a signal line SL or SL-1 according to an embodiment. Referring to FIG. 2A, the signal line SL may be disposed on a supporter BS. The supporter BS may be, for example, a first base layer BS1, a thin encapsulation layer TFE, or a first touch insulating layer TS-IL1, which will be described in more detail with reference to FIG. 7B or 9A. However, the invention is not limited to this example, and in an embodiment, if the signal line SL can be supported by the supporter BS, there is no limitation on the supporter BS.

Referring to FIG. 2A, the signal line SL may include a conductive layer CL and a capping layer CAP. The conductive layer CL may be formed of or include a conductive material. For example, the conductive layer CL may be formed of or include at least one of metallic materials. In detail, the conductive layer CL may be formed of or include at least one of copper, aluminum, molybdenum, titanium, silver, or zinc. In an embodiment, the conductive layer CL may be formed of or include copper whose resistance is low, and it may be possible to realize a fast signal transmission speed. However, the invention is not limited to this example, and in an embodiment, the conductive layer CL may be formed of or include at least one of other conductive materials, such as indium-tin-oxide (ITO), indium-zinc-oxide (IZO), and graphene.

The conductive layer CL may have a thickness ranging from about 3,000 Å to 15,000 Å. When the thickness of the conductive layer CL is smaller than about 3,000 Å, the signal line SL may have high contact resistance, and when the thickness of the conductive layer CL is greater than about 15,000 Å, the supporter BS (e.g., the first base layer BS1 of FIG. 7B) supporting the signal line SL may be easily damaged by a tensile stress.

FIGS. 2A and 2B illustrate examples, in which the conductive layer CL has a single-layered structure, but in an embodiment, the conductive layer CL may have a multi-layered structure. In a multi-layered structure, the conductive layer CL may include layers, which contain different metal atoms or which contain the same metal atoms but differ from each other in terms content ratio of the metal atom.

The capping layer CAP may be disposed (or directly disposed) on the conductive layer CL. The capping layer CAP may include vanadium nitride (VN) and zinc oxide (ZnO). Since the vanadium nitride has low reflectance, the capping layer CAP may have a reflectance lower than the conductive layer CL. Accordingly, the signal line SL including the capping layer CAP may have low reflectance to an incident external light and may not be recognized by a user. Since the capping layer CAP includes the zinc oxide, the signal line may be formed by a wet process. For example, where the capping layer includes only the vanadium nitride, there may be a difficulty in a patterning process using an etching solution, but due to the zinc oxide included in the capping layer CAP according to an embodiment, the capping layer CAP may be patterned by an etching process.

The capping layer CAP may further include aluminum oxide ($Al_2O_3$). When the capping layer CAP further includes the aluminum oxide, the capping layer CAP may be deposited through a DC sputtering process. This may make it possible to deposit the capping layer having a uniform thin thickness, on a large area.

A content of the vanadium nitride in the capping layer CAP may range from about 25 at % to about 80 at %. For example, the content of the vanadium nitride in the capping layer CAP may range from about 30 at % to about 70 at %. When the content of the vanadium nitride in the capping layer CAP is less than 25 at %, reflectance of the capping layer CAP may be increased. This may lead to an increase in reflectance of the signal line SL to an external light and a reduction in visibility of the display device DD. When the content of the vanadium nitride in the capping layer CAP is greater than 80 at %, the content of zinc oxide (ZnO) or aluminum oxide ($Al_2O_3$) in the capping layer CAP may be reduced, and this may lead to various technical issues in an etching or sputtering process. In this specification, the unit "at %" means atomic percentage.

A content of the zinc oxide in the capping layer CAP may range from about 20 at % to about 70 at %. For example, the content of the zinc oxide in the capping layer CAP may range from about 30 at % to about 60 at %. When the content of the zinc oxide in the capping layer CAP is less than about 20 at %, an etch rate of the capping layer CAP may be lowered, and this may lead to a difficulty in patterning the capping layer CAP through an etching process. When the content of the zinc oxide in the capping layer CAP is greater than about 70 at %, the etch rate of the capping layer CAP may be excessively high, and this may lead to a difficulty in controlling the etching process.

A content of the aluminum oxide in the capping layer CAP may range from about 3 at % to about 10 at %. When the content of the aluminum oxide in the capping layer CAP is less than 3 at %, it may be difficult to deposit the capping layer CAP through a DC sputtering process. When the content of the aluminum oxide in the capping layer CAP is greater than 10 at %, optical characteristics of the capping layer CAP may be deteriorated.

The capping layer CAP may have a thickness ranging from about 200 Å to about 1500 Å. When the thickness of the capping layer CAP is within the range, it may be possible to increase destructive interference of a visible light incident from the outside and thereby to increase an amount of vanishing ratio of the visible light. For example, when the thickness of the capping layer ranges from about 200 Å to about 1500 Å, a destructive interference amount of a green light having a central wavelength of about 550 nm may be increased. Thus, the display device DD may have a satisfactory reflectance property to an external light and may have an improved visibility property.

The thickness of the capping layer CAP may be equal to or less than about 1000 Å. When the thickness of the capping layer CAP is greater than 1000 Å, it may take a long time to etch the capping layer CAP, and thus, in the process of etching the capping layer CAP and the conductive layer CL, the capping layer CAP may be formed to have a width W2 that is greater than a width W1 of the conductive layer CL. For example, a tip portion may be formed, and this may lead to deterioration in reliability of the display device DD.

A mean reflectance of the capping layer CAP to a visible light may be equal to or less than about 25%, and in particular, equal to or less than about 20%.

A mean reflectance of the signal line SL to a visible light may be equal to or less than about 20%, and in particular, equal to or less than about 10%. Referring to FIG. 2B, the signal line SL-1 may further include an intermediate layer ML, which is disposed between the conductive layer CL and the capping layer CAP. The intermediate layer ML may be disposed (or directly disposed) between the conductive layer CL and the capping layer CAP. The intermediate layer ML may have a refractive index, which is between a refractive index of the conductive layer CL and a refractive index of the capping layer CAP. For example, a refractive index $n_{ml}$ of the intermediate layer ML may be given by the following equation 1.

$$n_{ml} = \sqrt{n_{cl} \times n_{cap}} \quad \text{[Equation 1]}$$

In the equation 1, $n_{ml}$ is a refractive index of the intermediate layer ML, $n_{cl}$ is a refractive index of the conductive layer CL, and $n_{cap}$ is a refractive index of the capping layer CAP.

Since the signal line SL-1 further includes the intermediate layer ML whose refractive index is between the refractive indices of the conductive layer CL and capping layer CL, it may be possible to reduce an amount of light, which is incident from the outside and is reflected toward the outside by an interface between the capping and conductive layers CAP and CL. Accordingly, it may be possible to more effectively reduce the optical reflectance of the signal line SL-1.

The intermediate layer ML may be formed of or include at least one of, for example, silicon oxide, silicon nitride, silicon oxynitride, titanium oxide, and aluminum oxide.

Figure 3A:
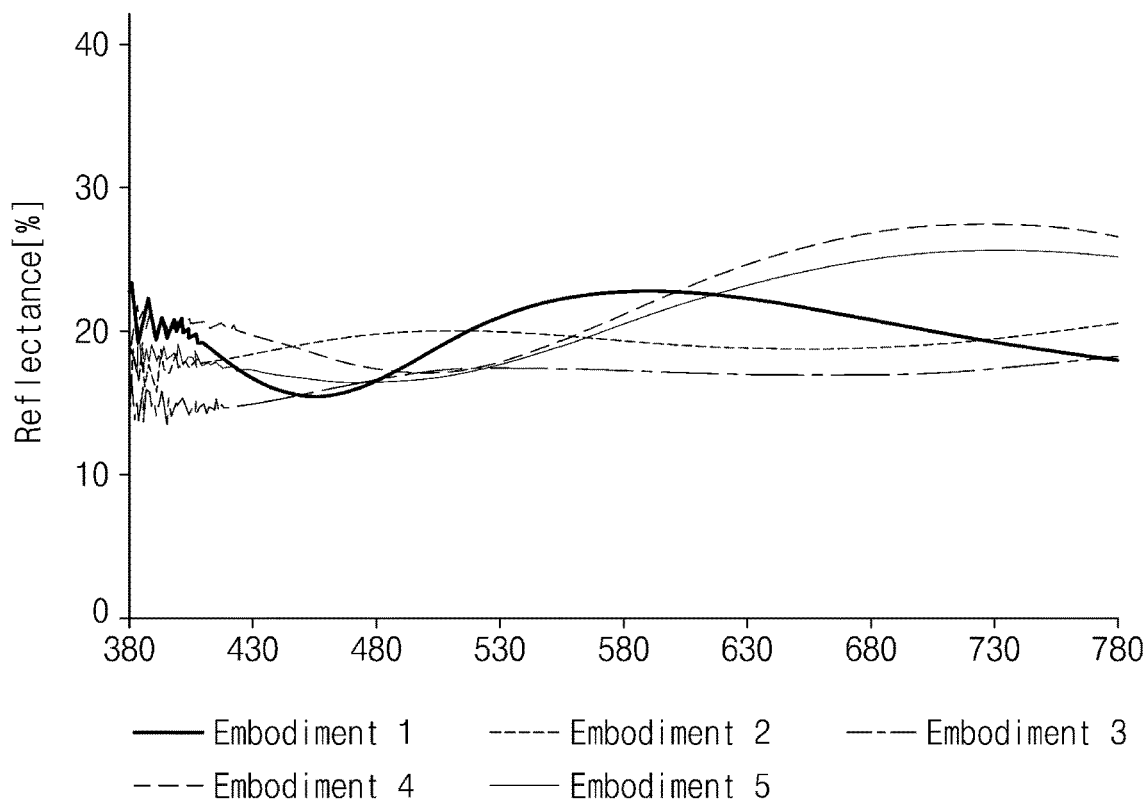
FIGS. 3A, 3B, 4A, and 4B are graphs illustrating optical reflectance properties according to some embodiments.
Figure 3B:
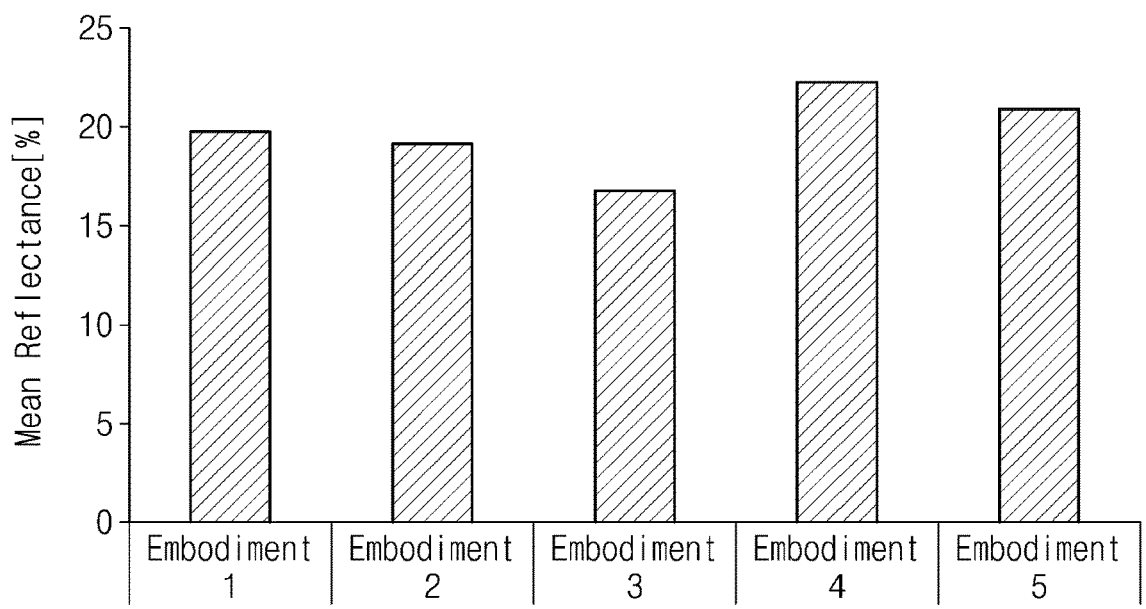

FIGS. 3A, 3B, 4A, and 4B are graphs illustrating optical reflectance properties according to some embodiments. FIGS. 3A and 3B show mean reflectance values of the capping layers CAP according to embodiments 1 to 5.

In the embodiments 1 to 5, the capping layer CAP was formed to have a thickness of 500 Å. The reflectance of the capping layer CAP to a visible light of about 380 nm-780 nm wavelength was measured using a spectrometer.

Each of the capping layers CAP according to the embodiments 1 to 5 was formed of vanadium nitride, zinc oxide, and aluminum oxide, and the contents of vanadium nitride, zinc oxide, and aluminum oxide are summarized in the following table 1.

TABLE 1

|  | Vanadium nitride (at %) | Zinc oxide (at %) | Aluminum oxide (at %) |
| --- | --- | --- | --- |
| Embodiment 1 | 40 | 55 | 5 |
| Embodiment 2 | 45 | 50 | 5 |
| Embodiment 3 | 50 | 45 | 5 |
| Embodiment 4 | 55 | 40 | 5 |
| Embodiment 5 | 60 | 35 | 5 |

Referring to FIGS. 3A and 3B, when, in the capping layer CAP, the contents of vanadium nitride, zinc oxide, and aluminum oxide were 25 at % to 80 at %, 20 at % to 70 at %, and 3 at % to 10 at %, respectively, the capping layer CAP exhibited excellent reflectance equal to or less than about 25%. When in the capping layer CAP, the contents of vanadium nitride, zinc oxide, and aluminum oxide were 40 at % to 60 at %, 35 at % to 55 at %, and 5 at %, respectively, the capping layer CAP exhibited excellent reflectance equal to or less than about 25%. Referring to FIG. 3A, the capping layers CAP according to the embodiments 1 to 5 exhibited a uniformly low reflectance property over the entire visible wavelength range. The excellent reflectance of about 16.8% was obtained in the embodiment 3, in which the content of the vanadium nitride was about 50 at %.

Figure 4A:
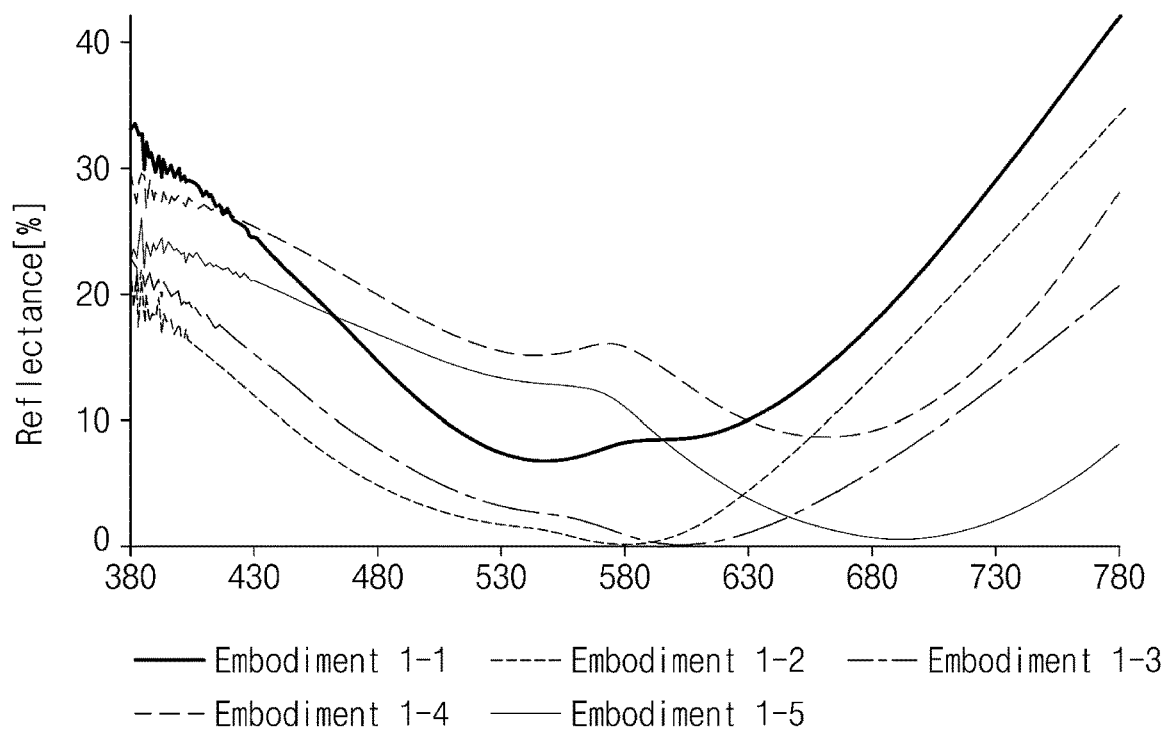
Figure 4B:
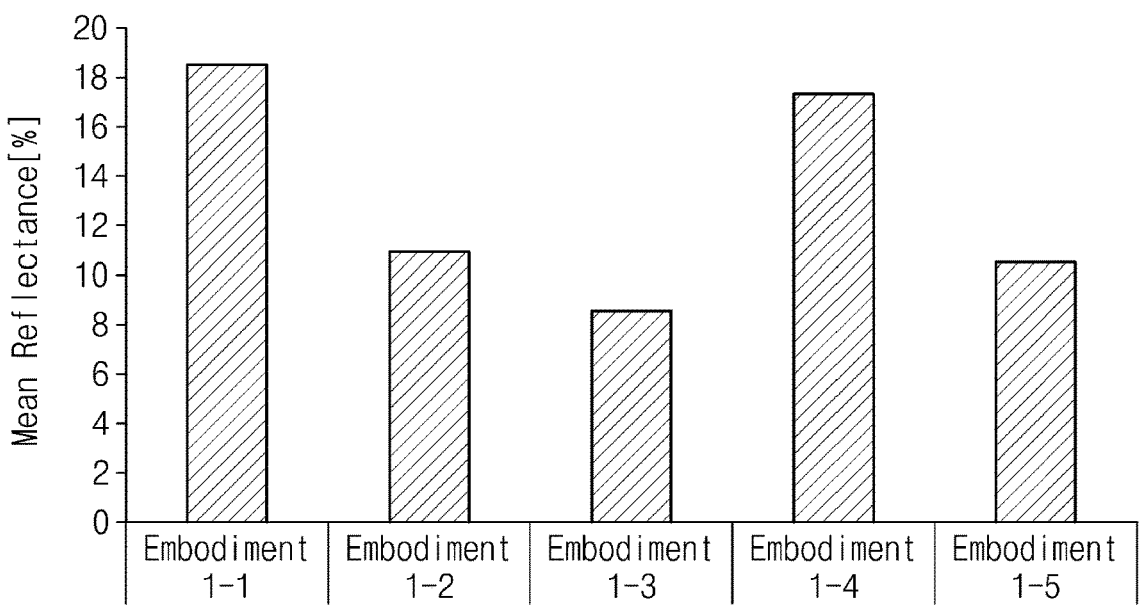

FIGS. 4A and 4B show mean reflectance values of the signal lines SL according to embodiments 1-1 to 1-5.

In the embodiments 1-1 to 1-5, the conductive layer CL was formed to have a thickness of 7000 Å, and the capping layer CAP was formed to have the same thickness as that in the embodiments 1 to 5. The reflectance of the signal line SL to a visible light of about 380 nm-780 nm wavelength was measured using a spectrometer.

In the signal lines SL according to the embodiments 1-1 to 1-5, the conductive layer CL was formed of copper. Each of the capping layers CAP according to the embodiments 1-1 to 1-5 was formed of vanadium nitride, zinc oxide, and aluminum oxide, and the contents of vanadium nitride, zinc oxide, and aluminum oxide therein were the same as those in the capping layers CAP according to the embodiments 1 to 5.

Referring to FIGS. 4A and 4B, the signal lines SL according to the embodiments 1-1 to 1-5 exhibited excellent reflectance equal to or less than about 20%. In particular, the measured reflectance was lower than the reflectance measured from the capping layer CAP alone, and the reflectance to a visible light whose wavelength ranges from about 550 nm to 650 nm was remarkably lowered. This is because an additional destructive interference effect was increased in a specific wavelength range by the conductive layer CL. In embodiments 1-2, 1-3, and 1-5, the signal lines SL exhibited excellent reflectance of about 10%.

As will be described below, the signal lines SL described with reference to FIGS. 2A to 4B may be used as gate lines, data lines, input electrodes, output electrodes, control electrodes, input sensing lines, and input sensing electrodes of the display device DD, and this may make it possible to improve the visibility of the display device DD. However, the embodiments are not limited to these examples of the signal line SL.

Figure 5:
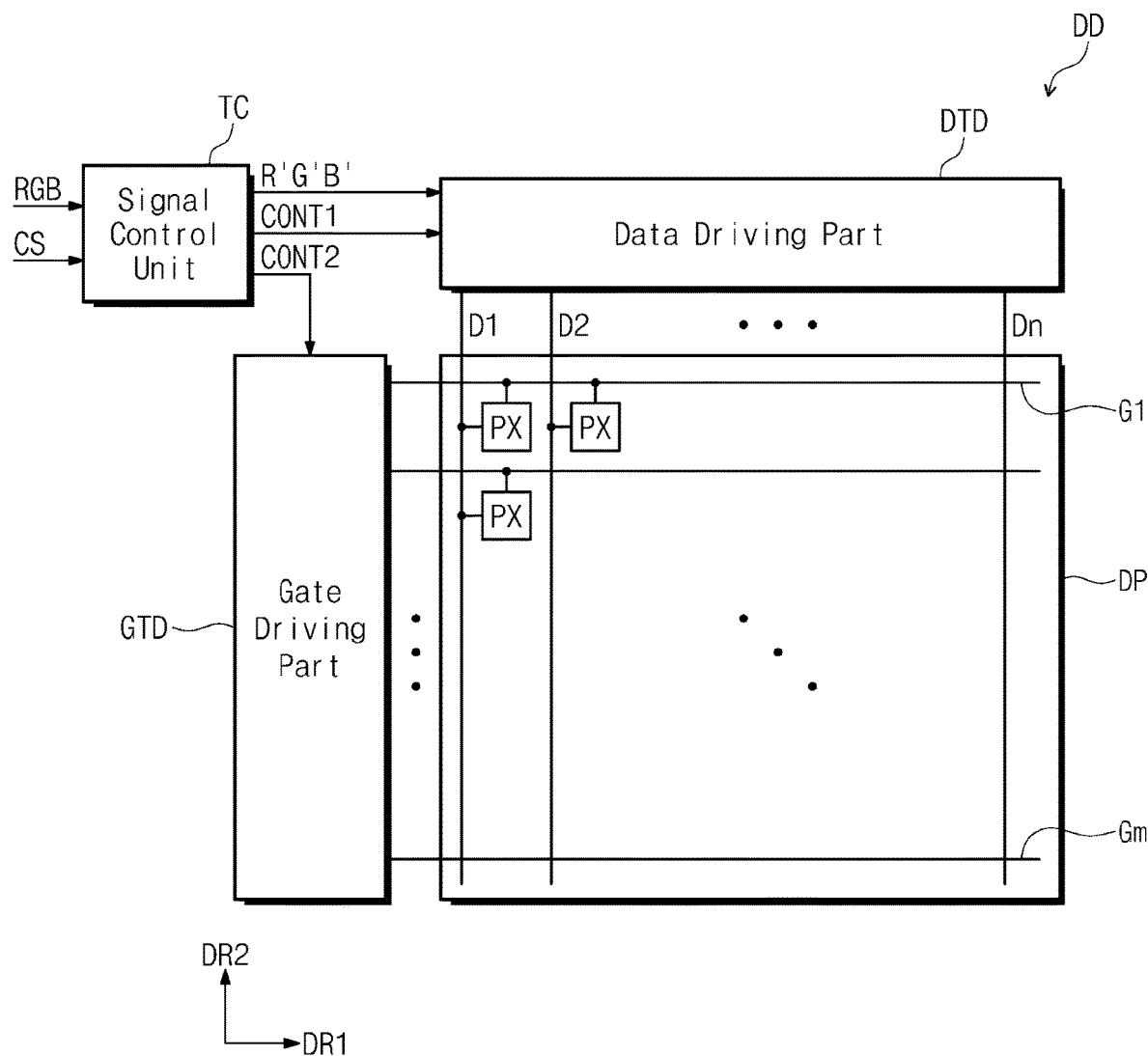
FIG. 5 is a schematic block diagram illustrating a display device according to an embodiment.
Figure 6:
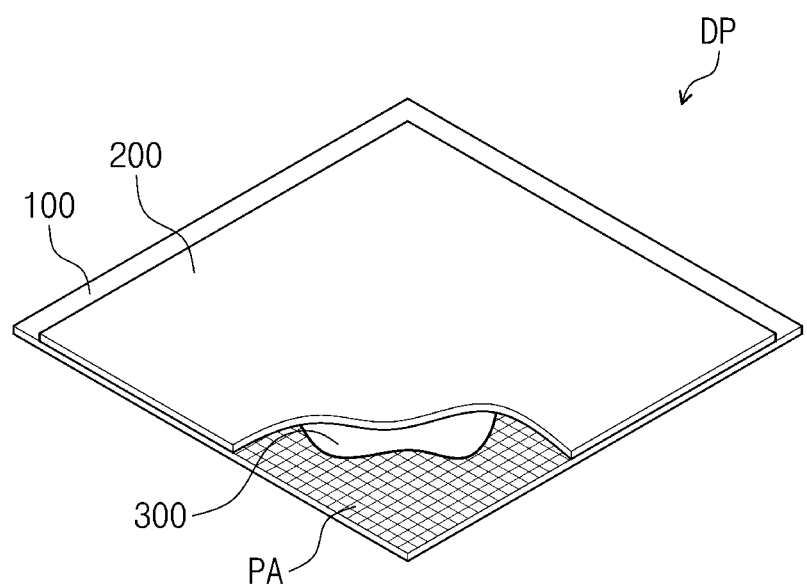
FIG. 6 is a plan view illustrating a portion of a display panel according to an embodiment.
Figure 7A:
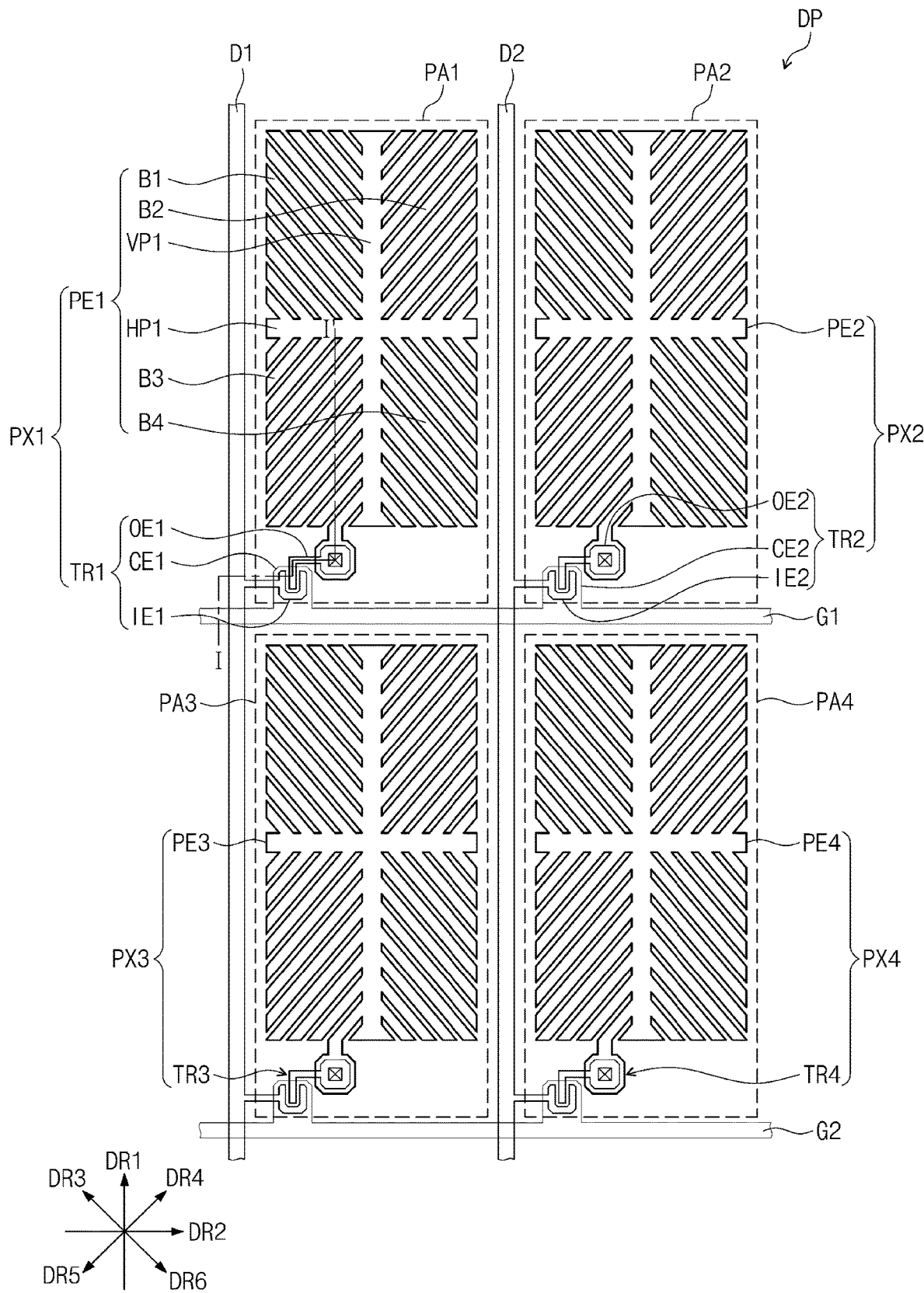
FIG. 7A is a plan view illustrating a portion of a display panel according to an embodiment.
Figure 7B:
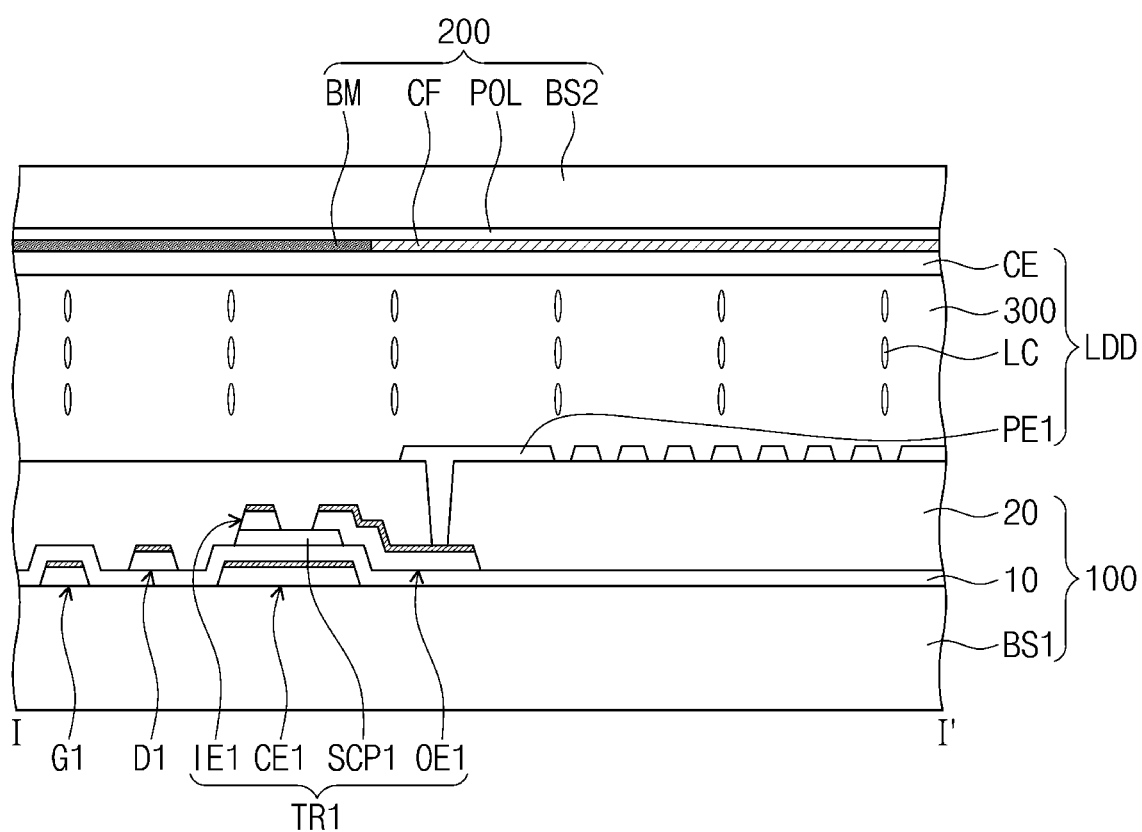
FIG. 7B is a schematic sectional view taken along a line I-I' of FIG. 7A.

FIG. 5 is a schematic block diagram illustrating the display device DD according to an embodiment. FIG. 6 is a plan view illustrating a portion of a display panel according to an embodiment. FIG. 7A is a plan view illustrating a portion of a display panel according to an embodiment. FIG. 7B is a schematic sectional view taken along a line I-I' of FIG. 7A.

As shown in FIG. 5, the display device DD may include a signal control unit TC, a gate driving part GTD, a data driving part DTD, and a display panel DP.

In an embodiment, the display panel DP may be electrically connected to the gate driving part GTD and the data driving part DTD and may be operated by electrical signals, which are provided from the gate driving part GTD and the data driving part DTD. The display panel DP may be, for example, one of an organic light emitting display panel, a liquid crystal display panel, a plasma display panel, an electrophoretic display panel, and an electrowetting display panel, but the embodiments are not limited to a specific kind of display panel. In FIGS. 5, 6, 7A, and 7B, a liquid crystal display device including the liquid crystal display element will be described as an example of the display device DD.

The display device DD may further include a backlight unit (not shown), which is used to provide light to the display panel DP, and an optical member including a polarizer. The display panel DP may control a transmission ratio of light emitted from the backlight unit to display an image. However, the embodiments are limited to this example, and where the display panel DP is provided as an organic light emitting display panel, the backlight unit may be omitted.

The display panel DP may include signal lines G1-Gm and D1-Dn and pixels PX electrically connected to the signal lines G1-Gm and D1-Dn. The signal lines G1-Gm and D1-Dn may include gate lines G1-Gm and data lines D1-Dn. In the specification, the gate lines G1-Gm may be referred to as first signal lines, and the data lines D1-Dn may be referred to as second signal lines.

The gate lines G1-Gm may be extended in the first direction DR1, may be arranged in the second direction DR2, and may electrically connect the gate driving part GTD to the pixels PX. The gate lines G1-Gm may provide gate signals, which are provided from the gate driving part GTD, to the pixels PX.

The data lines D1-Dn may be extended in the second direction DR2 and may be arranged in the first direction DR1. The data lines D1-Dn may electrically connect the data driving part DTD to the pixels PX. The data lines D1-Dn may provide data signals, which are provided from the data driving part DTD, to the pixels PX. The data lines D1-Dn may be provided to cross the gate lines G1-Gm and may be electrically disconnected from the gate lines G1-Gm.

Each of the pixels PX may be electrically connected to a corresponding one of the gate lines G1-Gm and a corresponding one of the data lines D1-Dn. Each of the pixels PX may include a thin-film transistor and a liquid crystal capacitor electrically connected thereto. Charge amounts of the liquid crystal capacitors of the pixels PX may be respectively controlled to display an image.

The signal control unit TC may provide electrical signals, which are used to control operations of the gate driving part GTD and the data driving part DTD, to the gate driving part GTD and the data driving part DTD. The signal control unit TC may receive input image signals RGB, may convert the input image signals RGB to image data R'G'B', which are suitable for the operations of the display panel DP, and may output the image data R'G'B'. The signal control unit TC may receive a variety of control signals CS (e.g., a vertical synchronization signal, a horizontal synchronization signal, a main clock signal, and a data enable signal) and may output first and second control signals CONT1 and CONT2.

The data driving part DTD may receive the first control signal CONT1 and the image data R'G'B'. The data driving part DTD may convert the image data R'G'B' to data voltages and may provide the converted data voltages to the data lines D1-Dn. The first control signal CONT1 may include a horizontal start signal for starting an operation of the data driving part DTD, an inverting signal for inverting a polarization of the data voltage, an output instruction signal for determining when the data voltage is output from the data driving part DTD, and so forth.

The gate driving part GTD may output gate signals to the gate lines G1-Gm in response to the second control signal CONT2. The second control signal CONT2 may include a vertical start signal for starting an operation of the gate driving part GTD, a gate clock signal for determining when a gate voltage is output, an output enable signal for determining an on-pulse width of the gate voltage, and so forth.

Referring to FIG. 6, the display panel DP may include a first substrate 100, a second substrate 200, and a liquid crystal layer 300. The first substrate 100 may include pixel regions PA. The pixels PX may be disposed in the pixel regions PA, respectively. In the embodiments, the pixel regions PA may be used to display lights, which are respectively produced by the pixels PX.

The liquid crystal layer 300 may be disposed between the first substrate 100 and the second substrate 200. The liquid crystal layer 300 may include liquid crystal molecules (not shown). The liquid crystal molecules may include a material whose alignment can be controlled by an electric field produced in the pixel regions PA.

FIG. 7A illustrates a plan view of the first substrate 100. For convenience in illustration, FIG. 7A illustrates a portion of the first substrate 100 corresponding to four adjacent pixel regions PA1, PA2, PA3, and PA4 of the pixel regions PA of FIG. 6. Hereinafter, an embodiment will be described with reference to FIGS. 7A and 7B.

Four pixels PX1, PX2, PX3, and PX4 may be disposed in four pixel regions PA1, PA2, PA3, and PA4, respectively. Each of the four pixels PX1, PX2, PX3, and PX4 may be electrically connected to a corresponding one of the gate lines and a portion of the data lines. For example, the four pixels PX1, PX2, PX3, and PX4 may include a first pixel PX1 electrically connected to a first gate line G1 and a first data line D1, a second pixel PX2 electrically connected to the first gate line G1 and a second data line D2, a third pixel PX3 electrically connected to a second gate line G2 and the first data line D1, and a fourth pixel PX4 electrically connected to the second gate line G2 and the second data line D2. For convenience in illustration, in the embodiments, one (hereinafter, a first pixel region PA1) of the four pixel regions PA1, PA2, PA3, and PA4 will be described as an example of the pixel regions.

The first pixel region PA1 may be used to display a light produced by the first pixel PX1. The pixels in other pixel regions may be disposed to have the structure corresponding to the first pixel PX1. However, the embodiments are not limited to this example or a specific embodiment, and in an embodiment, the pixels in other pixel regions may have a structure different from that in the first pixel region PA1.

The first pixel PX1 may include a first thin film transistor TR1 and a first liquid crystal capacitor. The first liquid crystal capacitor may include a first pixel electrode PE1, a common electrode CE, and the liquid crystal layer 300.

The first substrate 100 may include the first base layer BS1, the first gate line G1, the second gate line G2, the first data line D1, the second data line D2, the first thin film transistor TR1, a second thin film transistor TR2, and insulating layers 10 and 20. The insulating layers 10 and 20 may include a first insulating layer 10 and a second insulating layer 20, as illustrated in FIG. 7B.

The first base layer BS1 may be formed of or include an insulating material. The first base layer BS1 may be optically transparent. Accordingly, light, which is produced by the backlight unit (not shown) disposed below the first base layer BS1, may be easily provided to the liquid crystal layer 300 through the first base layer BS1. The first base layer BS1 may include, for example, a glass substrate or a plastic substrate. In detail, the first base layer BS1 may be a flexible substrate and may include at least one of a plastic substrate, a glass substrate, a metal substrate, or a substrate made of an organic/inorganic composite material. The plastic substrate may include at least one of acrylic resins, methacryl resins, polyisoprene resins, vinyl resins, epoxy resins, urethane resins, cellulose resins, siloxane resins, polyimide resins, polyamide resins, or perylene resins.

The first gate line G1 and the second gate line G2 may be disposed between the first base layer BS1 and the first insulating layer 10. The first gate line G1 may include a portion (hereinafter, a first control electrode CE1) protruding parallel to the first direction DR1. The first thin film transistor TR1 may be electrically connected to the first gate line G1 to receive a gate signal provided from the first gate line G1.

The first insulating layer 10 may cover the first gate line G1 and the first control electrode CE1. The first insulating layer 10 may be formed of or include at least one of organic and/or inorganic materials.

A first semiconductor pattern SCP1 may be disposed on the first insulating layer 10. The first semiconductor pattern SCP1 may be spaced apart from the first control electrode CE1, with the first insulating layer 10 interposed therebetween, when viewed in a schematic sectional view.

The first semiconductor pattern SCP1 may be formed of or include at least one of semiconductor materials. For example, the semiconductor materials may include at least one of amorphous silicon, poly silicon, single crystalline silicon, oxide semiconductor, or compound semiconductor.

The second insulating layer 20 may cover a first input electrode IE1 and a first output electrode OE1. The second insulating layer 20 may be formed of or include at least one of organic and/or inorganic materials. The first input electrode IE1 and the first output electrode OE1 may be disposed between the first insulating layer 10 and the second insulating layer 20.

The first input electrode IE1 may be a portion of the first data line D1 protruding in the second direction DR2. The first input electrode IE1, the first output electrode OE1, and the first data line D1 may be disposed on a same layer. For example, the first input electrode IE1, the first output electrode OE1, and the first data line D1 may be disposed on the first insulating layer 10.

When viewed in a plan view, the first input electrode IE1 may have a shape enclosing an end of the first output electrode OE1. An opposite end of the first output electrode OE1 may be extended from the end and may overlap a contact hole for electrical connection with the first pixel electrode PE1. Each of the first input electrode IE1 and the first output electrode OE1 may be disposed on the first semiconductor pattern SCP1 to be in direct contact with the first semiconductor pattern SCP1.

However, the invention is not limited to this example, and in an embodiment, the first input electrode IE1 and the first output electrode OE1 may be disposed on a layer different from the first semiconductor pattern SCP1 and may be coupled to the first semiconductor pattern SCP1 through an additional contact hole or the like. The structure of the first thin film transistor TR1 may be variously changed, but the embodiments are not limited to a specific structure of the first thin film transistor TR1.

In an embodiment, at least one of the gate lines G1 and G2 and the data lines D1 and D2 may have the same structure as the signal line SL or SL-1 described with respect to FIG. 2A or 2B. For example, as shown in FIG. 7B, all of the gate lines G1 and G2 and the data lines D1 and D2 may have the same structure as the signal line SL or SL-1 described with reference to FIGS. 2A and 2B. Thus, the gate lines G1 and G2 and the data lines D1 and D2 of the display device DD may have low reflectance to an external light and may not be recognized by a user. Accordingly, the visibility of the display device DD may be improved. However, the invention is not limited to this example, and in an embodiment, at least one of the data and gate lines D1, D2, G1, and G2 may have a different structure from the signal line SL or SL-1 described with reference to FIGS. 2A and 2B.

In the embodiments, the first control electrode CE1 may diverge from the first gate line G1 and may have the same layer structure as the first gate line G1. The first input electrode IE1 may diverge from the first data line D1 and may have the same layer structure as the first data line D1. The first output electrode OE1 and the first data line D1 may be disposed on the same layer. The first control electrode CE1, the first input electrode IE1, the first output electrode OE1 may have the same structure as the signal line SL or SL-1 described with reference to FIG. 2A or FIG. 2B. Thus, the visibility of the display device DD may be improved.

The first pixel electrode PE1 may be disposed on the second insulating layer 20. The first pixel electrode PE1 and a second pixel electrode PE2 may be spaced apart from each other, in the second direction DR2, with the second data line D2 interposed therebetween. A third pixel electrode PE3 and a fourth pixel electrode PE4 may be spaced apart from the first pixel electrode PE1 and the second pixel electrode PE2, respectively, with the first gate line G1 interposed therebetween.

The first pixel electrode PE1 may penetrate the second insulating layer 20 and may be coupled to the first thin film transistor TR1. The first pixel electrode PE1 may receive a voltage, which is output from the first thin film transistor TR1.

The first pixel electrode PE1 may include a first vertical portion VP1, a first horizontal portion HP1, and branch portions B1-B4. The first vertical portion VP1, the first horizontal portion HP1, and the branch portions B1-B4 may be electrically connected to each other to form a single object serving as the first pixel electrode PE1.

The first vertical portion VP1 may be extended in the first direction DR1. The first vertical portion VP1 may be extended parallel to the first data line D1 and the second data line D2.

The first horizontal portion HP1 may be electrically connected to the first vertical portion VP1. The first horizontal portion HP1 may be extended in the second direction DR2. The first horizontal portion HP1 may cross the first vertical portion VP1 and may be electrically connected to the first vertical portion VP1. In the embodiment, the first vertical portion VP1 and the first horizontal portion HP1 are illustrated to intersect with respective center portions thereof. However, the invention is not limited to this example, and in an embodiment, the first horizontal portion HP1 may be disposed at a position shifted from the center portion of the first vertical portion VP1 toward an end. In certain embodiments, the first vertical portion VP1 may be disposed at a position shifted from the center portion of the first horizontal portion HP1 toward an end, but the invention is not limited to a specific embodiment.

The branch portions B1-B4 may be electrically connected to the first horizontal portion HP1 or the first vertical portion VP1. Each of the branch portions B1-B4 may be extended in a direction crossing the first and second directions DR1 and DR2.

The branch portions B1-B4 may be radially extended from the first horizontal portion HP1 and the first vertical portion VP1. The branch portions B1-B4 may be classified into a plurality of branch portions, depending on its extension direction.

For example, the branch portions B1-B4 may include first to fourth branch portions B1-B4. Slits may be formed between the first to fourth branch portions B1-B4. The slits may correspond to empty spaces between the first to fourth branch portions B1-B4.

The first branch portions B1 may be extended from the first horizontal portion HP1 or the first vertical portion VP1 in the third direction DR3. The first branch portions B1 may be patterns, which are arranged to be spaced apart from each other in a fourth direction DR4.

The second branch portions B2 may be extended from the first horizontal portion HP1 or the first vertical portion VP1 in the fourth direction DR4. The second branch portions B2 may be patterns, which are arranged to be spaced apart from each other in the third direction DR3.

The third branch portions B3 may be extended from the first horizontal portion HP1 or the first vertical portion VP1 in a fifth direction DR5. The third branch portions B3 may be patterns, which are arranged to be spaced apart from each other in the third direction DR3.

The fifth direction DR5 may be an opposite direction of the fourth direction DR4. Thus, the third branch portions B3 may be extended parallel to the second branch portions B2.

The fourth branch portions B4 may be extended from the first horizontal portion HP1 or the first vertical portion VP1 in a sixth direction DR6. The fourth branch portions B4 may be patterns, which are arranged to be spaced apart from each other in the fourth direction DR4.

The sixth direction DR6 may be an opposite direction of the third direction DR3. The fourth branch portions B4 may be extended parallel to the first branch portions B1.

Since the first pixel electrode PE1 includes the branch portions B1-B4, it may be possible to realize various gradations in a single pixel region. For example, regions, in which the first, second, third, and fourth branch portions B1, B2, B3, and B4 are respectively disposed, may be defined as separate domains.

Liquid crystal molecules in the liquid crystal layer 300 may have alignment characteristics that are dependent on the extension directions of first to fourth branch portions B1-B4. Thus, it may be possible to realize various gradations in respective domains of the single pixel region, and thus, the display panel DP may be used to display an image with improved color reproduction characteristics and to realize a high-resolution display device.

Referring to FIG. 7B, the second substrate 200 may include a second base layer BS2, a polarization layer POL, a color filter CF, and a light-blocking layer BM. The second base layer BS2 may be an optically transparent insulating substrate.

The polarization layer POL may be disposed on the second base layer BS2. The polarization layer POL may block a portion of an external light. The polarization layer POL may serve as an anti-reflection layer minimizing reflection of the external light. Thus, the visibility of the display device DD may be improved. The polarization layer POL may include a circular or linear polarizer or and a λ/4 phase retarder.

The light-blocking layer BM and the color filter CF may be disposed on the polarization layer POL.

The light-blocking layer BM may be disposed between the pixels PX. The light-blocking layer BM may include carbon black particles. Since the light-blocking layer BM is disposed, it may be possible to prevent a light mixing issue from occurring between adjacent pixel regions. In an embodiment, the light-blocking layer BM may be omitted.

The color filter CF may be disposed adjacent to portions of the light-blocking layer BM. In an embodiment, the color filter CF may be disposed between portions of the light-blocking layer BM. The color filter CF may transmit light in a desired wavelength range and to absorb light in other wavelength range. For example, the color filter CF may be a blue color filter transmitting blue light, a green color filter transmitting green light, or a color filter transmitting red light.

A liquid crystal display element LDD may be disposed between the first substrate 100 and the second substrate 200. The liquid crystal display element LDD may include the first pixel electrode PE1, the liquid crystal layer 300, and the common electrode CE. The liquid crystal layer 300 may include a liquid crystal molecule LC. Since FIG. 7B illustrates the first pixel region PA1, the first pixel electrode PE1 is illustrated in FIG. 7B.

The common electrode CE may produce an electric field, along with the first pixel electrode PE1. The common electrode CE may overlap each of the pixel electrodes PE1, PE2, PE3, and PE4.

The display panel DP may further include alignment layers. The alignment layers may be respectively disposed between the liquid crystal layer 300 and the second insulating layer 20 and between the liquid crystal layer 300 and the common electrode CE. Each of the alignment layers may be used to control an initial alignment of the liquid crystal molecule LC.

Figure 8A:
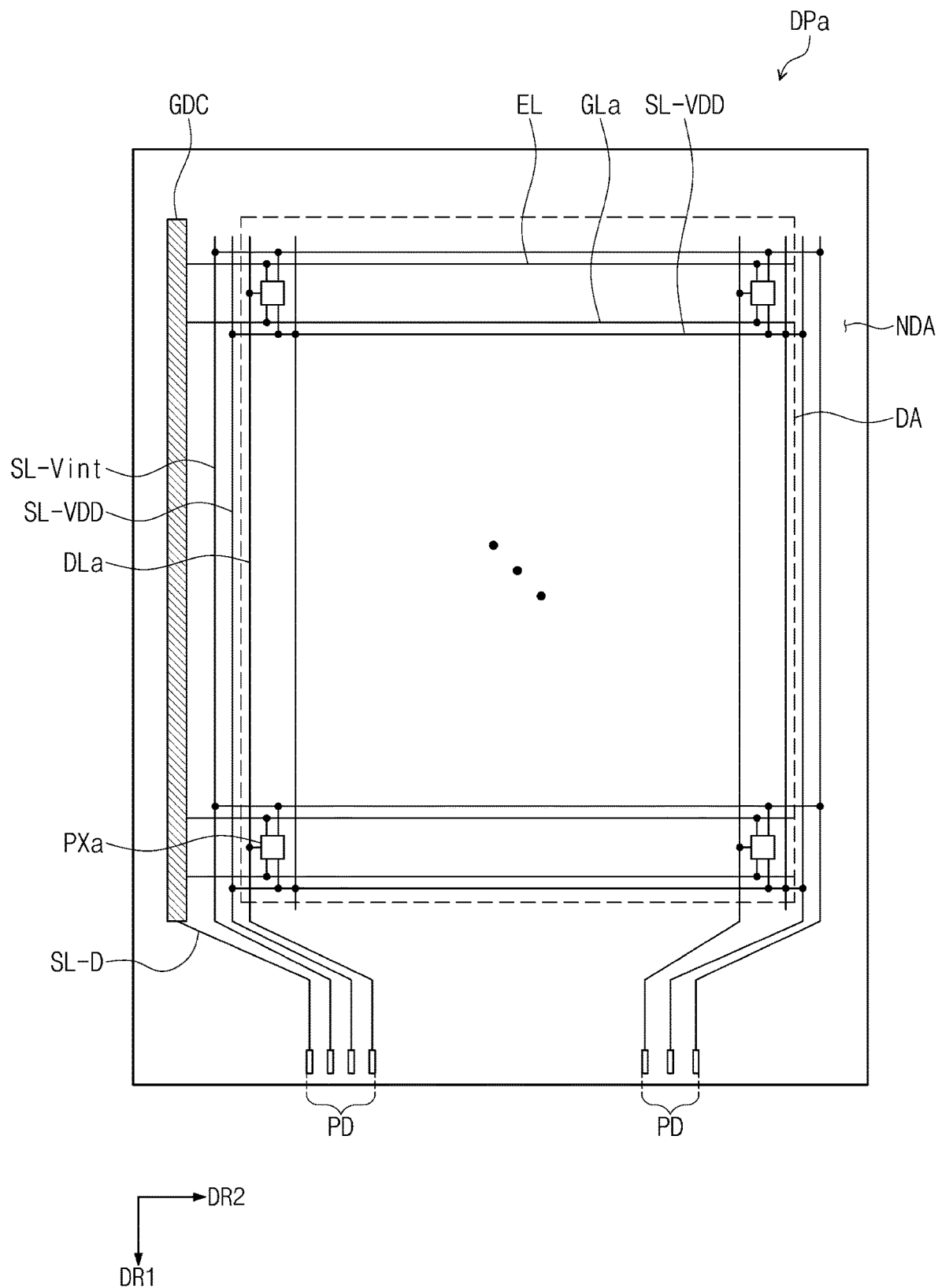
FIG. 8A is a plan view illustrating a display panel according to an embodiment.
Figure 8B:
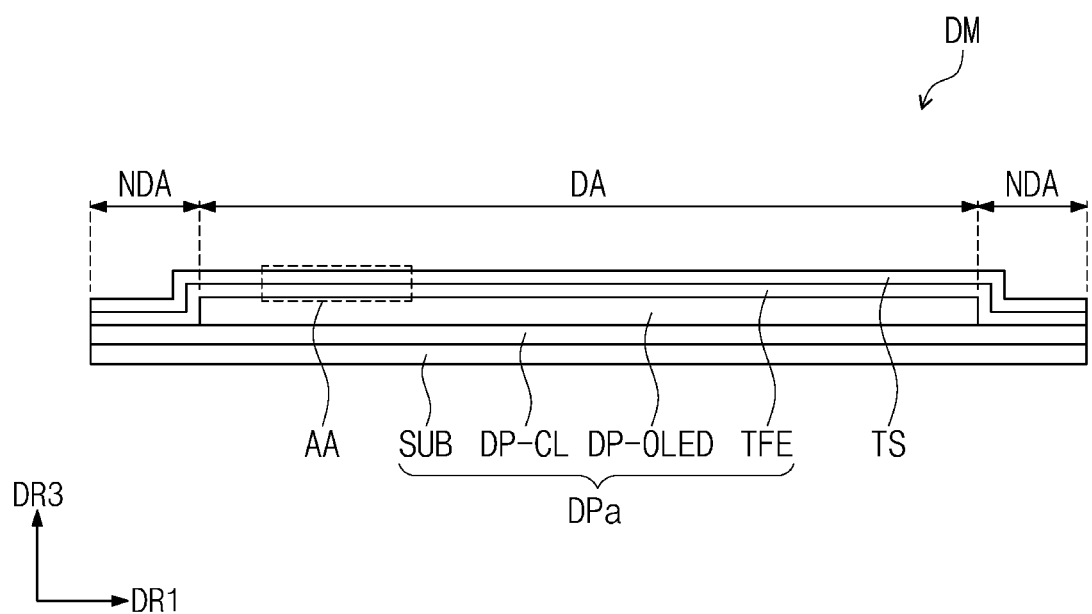
FIG. 8B is a schematic sectional view illustrating a display module according to an embodiment.

FIG. 8A is a plan view illustrating a display panel DPa according to an embodiment. FIG. 8B is a schematic sectional view illustrating a display module DM according to an embodiment. FIG. 8A illustrates an example, in which the display panel DPa is an organic light emitting display panel.

As shown in FIG. 8A, the organic light emitting display panel DPa may include a display region DA and a non-display region NDA, when viewed in a plan view. The display and non-display regions DA and NDA of the organic light emitting display panel DPa may correspond to the display and non-display regions DD-DA and DD-NDA, respectively, of the display device DD of FIG. 1. In an embodiment, the display and non-display regions DA and NDA of the organic light emitting display panel DPa may be different from the display and non-display regions DD-DA and DD-NDA of the display device DD of FIG. 1 in at least one of their positions, shapes, or areas, depending on the structure and/or design of the organic light emitting display panel DPa.

The organic light emitting display panel DPa may include the pixels PXa. A region, in which the pixels PXa are disposed, may be defined as the display region DA. In the embodiment, the non-display region NDA may be defined along an edge of the display region DA.

The organic light emitting display panel DPa may include gate lines GLa, data lines DLa, light-emitting lines EL, a control signal line SL-D, an initializing voltage line SL-Vint, a voltage line SL-VDD, and a pad portion PD.

Each of the gate lines GLa may be electrically connected to corresponding ones of the pixels PXa, and each of the data lines DLa may be electrically connected to corresponding ones of the pixels PXa. The light-emitting lines EL may be arranged parallel to a corresponding one of the gate lines GLa. The control signal line SL-D may provide control signals to a gate driving circuit GDC. The initializing voltage line SL-Vint may provide an initialization voltage to the pixels PXa. The voltage line SL-VDD may be electrically connected to the pixels PXa to provide a first voltage to the pixels PXa. The voltage line SL-VDD may include lines extending in the first direction DR1 and lines extending in the second direction DR2.

The gate driving circuit GDC electrically connected to the gate lines GLa and the light-emitting lines EL may be disposed in one of side regions of the non-display region NDA. Some of the gate lines GLa, the data lines DLa, the light-emitting lines EL, the control signal line SL-D, the initializing voltage line SL-Vint, and the voltage line SL-VDD may be disposed on the same layer, and the others may be disposed on another layer.

The pad portion PD may be electrically connected to an end of each of the data lines DLa, the control signal line SL-D, the initializing voltage line SL-Vint, and the voltage line SL-VDD.

At least one of the gate lines GLa, the data lines DLa, the light-emitting lines EL, the control signal line SL-D, the initializing voltage line SL-Vint, and the voltage line SL-VDD may have the same structure as the signal line SL or SL-1 described with reference to FIG. 2A or 2B. It may be possible to reduce the reflectance of the display device DD to an external light and to improve the visibility of the display device DD. This will be described in more detail below.

As shown in FIG. 8B, the organic light emitting display panel DPa may include a base layer SUB, a circuit layer DP-CL disposed on the base layer SUB, an organic light emitting display element DP-OLED disposed on the circuit layer DP-CL, and the thin encapsulation layer TFE provided on the organic light emitting display element DP-OLED.

The base layer SUB may include at least one plastic film. The base layer SUB may be a flexible substrate and may include at least one of a plastic substrate, a glass substrate, a metal substrate, or a substrate made of an organic/inorganic composite material. The plastic substrate may include at least one of acrylic resins, methacryl resins, polyisoprene resins, vinyl resins, epoxy resins, urethane resins, cellulose resins, siloxane resins, polyimide resins, polyamide resins, or perylene resins.

The circuit layer DP-CL may include insulating layers, conductive layers, and a semiconductor layer. The conductive layers of the circuit layer DP-CL may constitute signal lines or a pixel control circuit.

In the disclosure, the organic light emitting display element DP-OLED may include an anode, a cathode, and functional layers and a light emitting layer, which are disposed between the anode and the cathode. The functional layers may include an electron transport layer or a hole transport layer, which are used to efficiently transport electrons or holes. The functional layers may be formed of or include an organic compound. The light emitting layer may be formed of or include an organic light emitting material, but the embodiments are not limited to this example. For example, the light emitting layer may be formed of or include a quantum dot light emitting material.

The thin encapsulation layer TFE may seal the organic light emitting display element DP-OLED. The thin encapsulation layer TFE may include at least one inorganic thin film and at least one organic thin film. For example, the thin encapsulation layer TFE may include at least two inorganic layers and an organic layer interposed therebetween. The inorganic layers may protect the organic light emitting display element DP-OLED from moisture or oxygen, and the organic layer may protect the organic light emitting display element DP-OLED from a contamination material, such as dust particles. The inorganic layer may include a silicon nitride layer, a silicon oxynitride layer, a silicon oxide layer, a titanium oxide layer, an aluminum oxide layer, or the like. The organic layer may include an acrylic organic layer, but the embodiments are not limited thereto. According to an embodiment, by adjusting a thickness of the organic layer, it may be possible to improve the uniformity in sensitivity of an input sensing unit TS. This will be described in more detail below.

The input sensing unit TS may be disposed (or directly disposed) on the thin encapsulation layer TFE. However, the embodiments are not limited to this example, and in an embodiment, an inorganic layer and the input sensing unit TS may be sequentially stacked on the thin encapsulation layer TFE. The inorganic layer may be a buffer layer. The inorganic layer may be at least one of a silicon nitride layer, a silicon oxynitride layer, or a silicon oxide layer. However, the embodiments are not limited to this example. Although the inorganic layer is described to be a separate element, the inorganic layer may be a part of the thin encapsulation layer TFE.

The input sensing unit TS may include input sensors and input signal lines. The input sensors and the input signal lines may have a single- or multi-layered structure.

The input sensors and the input signal lines may be formed of or include at least one of indium tin oxide (ITO), indium zinc oxide (IZO), zinc oxide (ZnO), indium tin zinc oxide (ITZO), PEDOT, metal nano wire, or graphene. In an embodiment, the input sensors and the input signal lines may include a metal layer (e.g., made of molybdenum, silver, titanium, copper, aluminum, or alloys thereof). The topmost layer of the input sensors and the input signal line may include the capping layer CAP (e.g., of FIG. 2A) according to an embodiment. The input sensors and the input signal lines may have the same layer structure or may have different layer structures from each other. The input sensing unit TS will be described in more detail below.

Figure 9A:
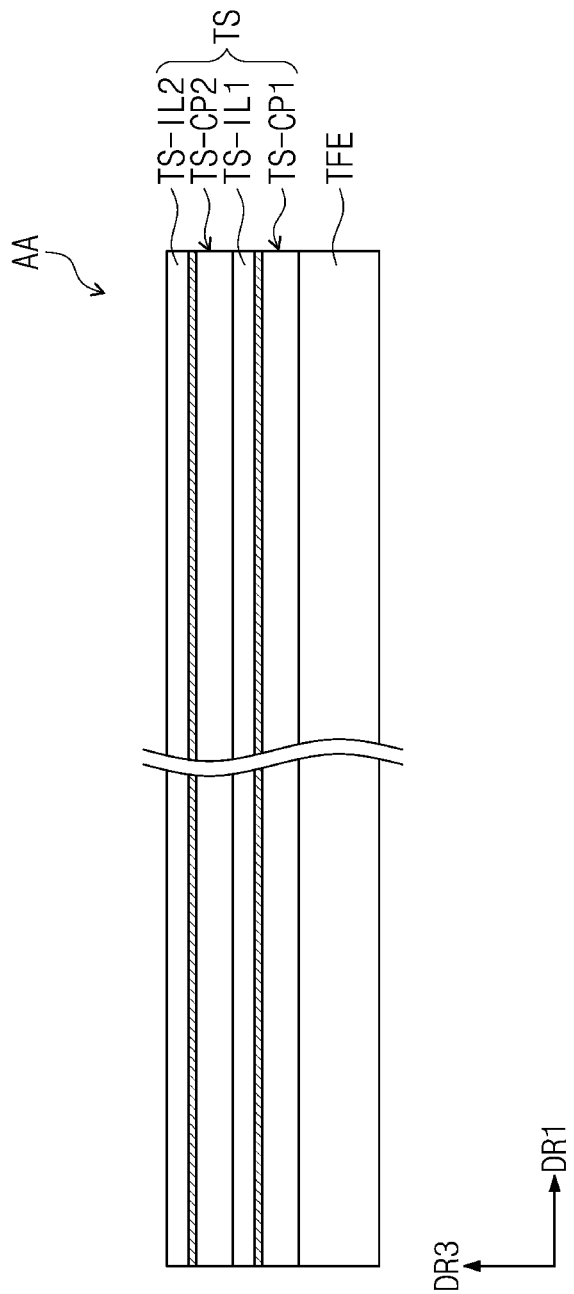
FIG. 9A is an enlarged schematic sectional view illustrating a portion 'AA' of FIG. 8B.

FIG. 9A is an enlarged schematic sectional view illustrating a portion 'AA' of FIG. 8B. In detail, FIG. 9A illustrates an enlarged structure of the input sensing unit TS of FIG. 8B. FIGS. 9B to 9E are plan views illustrating the input sensing unit TS according to an embodiment.

As shown in FIG. 9A, the input sensing unit TS may include a first conductive pattern TS-CP1, a first insulating layer TS-IL1 (hereinafter, a first touch insulating layer), a second conductive pattern TS-CP2, and a second touch insulating layer TS-IL2 (hereinafter, a second touch insulating layer). The first conductive pattern TS-CP1 may be disposed (or directly disposed) on the thin encapsulation layer TFE. However, the invention is not limited to this example, and in an embodiment, an additional inorganic layer (e.g., a buffer layer) may be further disposed between the first conductive pattern TS-CP1 and the thin encapsulation layer TFE.

In certain embodiments, the second touch insulating layer TS-IL2 may be omitted. A portion of the second conductive pattern TS-CP2 may cross the first conductive pattern TS-CP1. The second conductive pattern TS-CP2 may be electrically disconnected from the first conductive pattern TS-CP1, with the first touch insulating layer TS-IL1 interposed therebetween, and may be provided to cross the first conductive pattern TS-CP1.

Each of the first and second conductive patterns TS-CP1 and TS-CP2 may have a double-layered structure, as shown. However, the embodiments are not limited to this example, and at least one of the first and second conductive patterns TS-CP1 and TS-CP2 may have a single-layered structure or a multi-layered structure, which includes three or more layers stacked in the third direction DR3.

Each of the first and second touch insulating layer TS-IL1 and TS-IL2 may have the same structure as the signal line SL or SL-1 described with reference to FIG. 2A or FIG. 2B. This will be described in more detail below.

The shape of the first touch insulating layer TS-IL1 may be variously changed, as long as the first touch insulating layer TS-IL1 can be used to electrically separate the first conductive pattern TS-CP1 from the second conductive pattern TS-CP2. The first touch insulating layer TS-IL1 may fully cover the thin encapsulation layer TFE or may include insulating patterns. In an embodiment, the insulating patterns may be provided to overlap the first connecting portions BR1 or second connecting portions BR2, which will be described below.

In the embodiment, a double-layered input sensing unit is illustrated as an example of the input sensing unit, but the invention is not limited to this example. A single-layered input sensing unit may include a conductive layer and an insulating layer covering the conductive layer. The conductive layer may include input sensors and input signal lines electrically connected to the input sensors. The single-layered input sensing unit may obtain coordinate information in a self-capacitance manner.

Figure 9B:
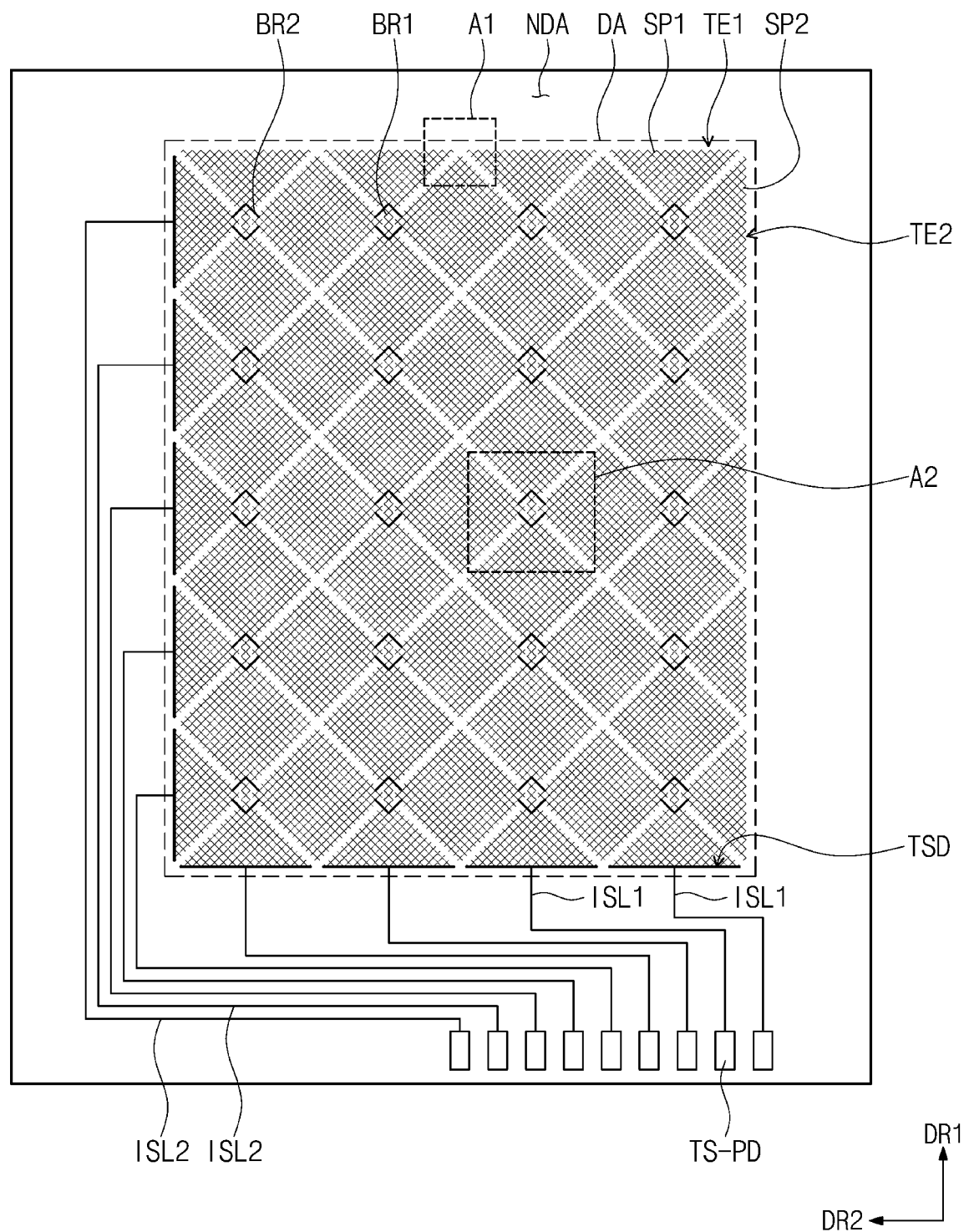
FIGS. 9B to 9E are plan views illustrating an input sensing unit according to an embodiment.

As shown in FIG. 9B, the input sensing unit TS may include first input sensing electrodes TE1 and second input sensing electrodes TE2. The first input sensing electrodes TE1 may include the first connecting portions BR1, first input sensor units SP1, which are electrically connected to each other by the first connecting portions BR1, and first input signal lines ISL1, which are electrically connected to the first input sensor units SP1. The second input sensing electrodes TE2 may include the second connecting portions BR2, second input sensor units SP2, which are electrically connected to each other by the second connecting portions BR2, and second input signal lines ISL2, which are electrically connected to the second input sensor units SP2. Connection electrodes TSD may be disposed between the first input sensing electrodes TE1 and the first input signal lines ISL1 and between the second input sensing electrodes TE2 and the second input signal lines ISL2. The connection electrodes TSD may be electrically connected to ends of the first and second input sensing electrodes TE1 and TE2 and may be used to transmit signals. In certain embodiments, the connection electrodes TSD may be omitted.

In the specification, the first input signal line ISL1 may be referred to as a first signal line, and the second input signal line ISL2 may be referred to as a second signal line.

The first input sensor units SP1 may be arranged in the first direction DR1, and the second input sensor units SP2 may be arranged in the second direction DR2. The first input sensor units SP1 and the second input sensor units SP2 may be spaced apart from each other.

The first input sensing electrodes TE1 may be extended in the first direction DR1 and may be spaced apart from each other in the second direction DR2. The second input sensing electrodes TE2 may be extended in the second direction DR2 and may be spaced apart from each other in the first direction DR1.

Each of the first connecting portions BR1 may electrically connect two adjacent first input sensor units SP1 to each other. Each of the second connecting portions BR2 may electrically connect two adjacent second input sensor units SP2 to each other. To provide better understanding of the embodiment, some of the first and second connecting portions BR1 and BR2 may be illustrated in FIG. 9B with an exaggerated thickness.

The input sensing unit TS may further include input pad portions TS-PD. Each of the first and second input signal lines ISL1 and ISL2 may be electrically connected to a corresponding one of the input pad portions TS-PD.

The first input sensor units SP1 may be capacitively coupled to the second input sensor units SP2. When input sensing signals are applied to the first input sensor units SP1, capacitors may be formed between the first input sensor units SP1 and the second input sensor units SP2.

Hereinafter, the input sensing unit TS will be described in more detail with reference to FIGS. 9C, 9D, and 9E.

Figure 9C:
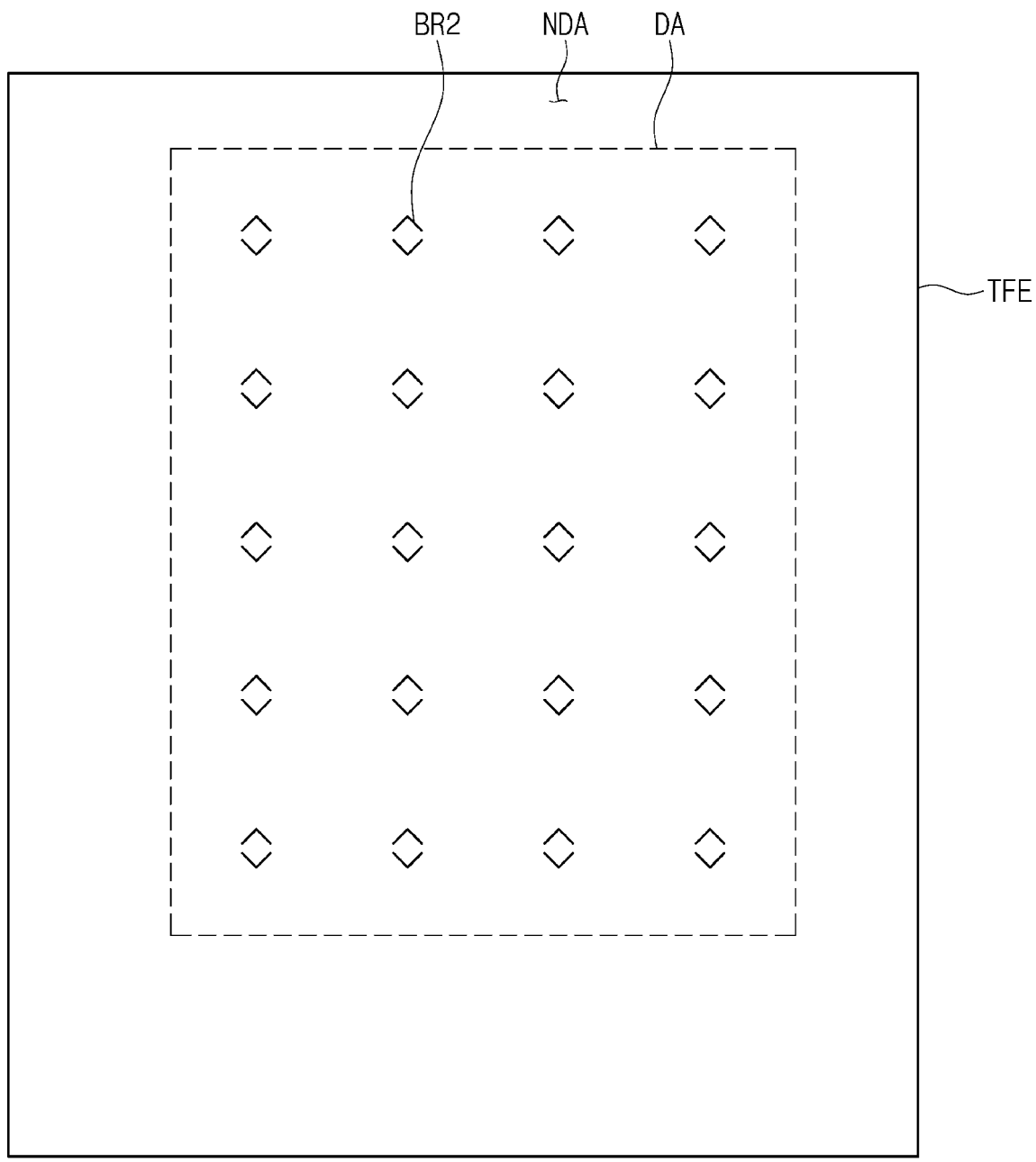
Figure 9D:
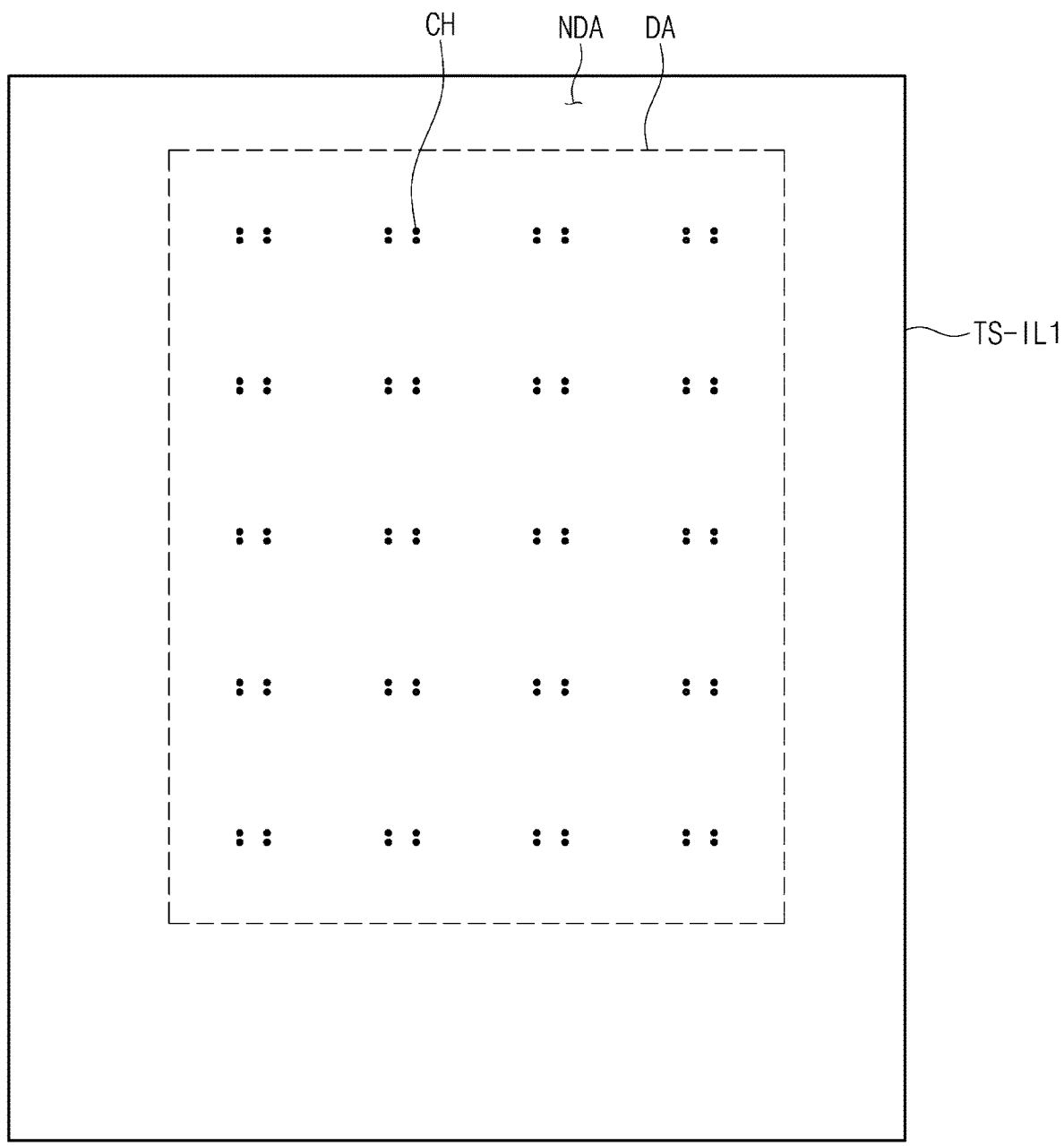

As shown in FIG. 9C, the first conductive pattern TS-CP1 may include the second connecting portions BR2. The second connecting portions BR2 may be formed by patterning a conductive layer, which is formed (or directly formed) on the thin encapsulation layer TFE of an organic light emitting display panel DPa. In other words, the first conductive pattern TS-CP1 may be disposed (or directly disposed) on the thin encapsulation layer TFE of the organic light emitting display panel DPa.

The first touch insulating layer TS-IL1 may be disposed on the first conductive pattern TS-CP1. The first touch insulating layer TS-IL1 may be disposed (or directly disposed) on the thin encapsulation layer TFE of the organic light emitting display panel DPa to cover each of the second connecting portions BR2. As shown in FIG. 9D, contact holes CH may be defined in the first touch insulating layer TS-IL1 to partially expose the second connecting portions BR2. The contact holes CH may be formed through a photolithography process. The second connecting portions BR2 of the first conductive pattern TS-CP1 may be electrically connected to the second input sensor units SP2 through the contact holes CH.

Figure 9E:
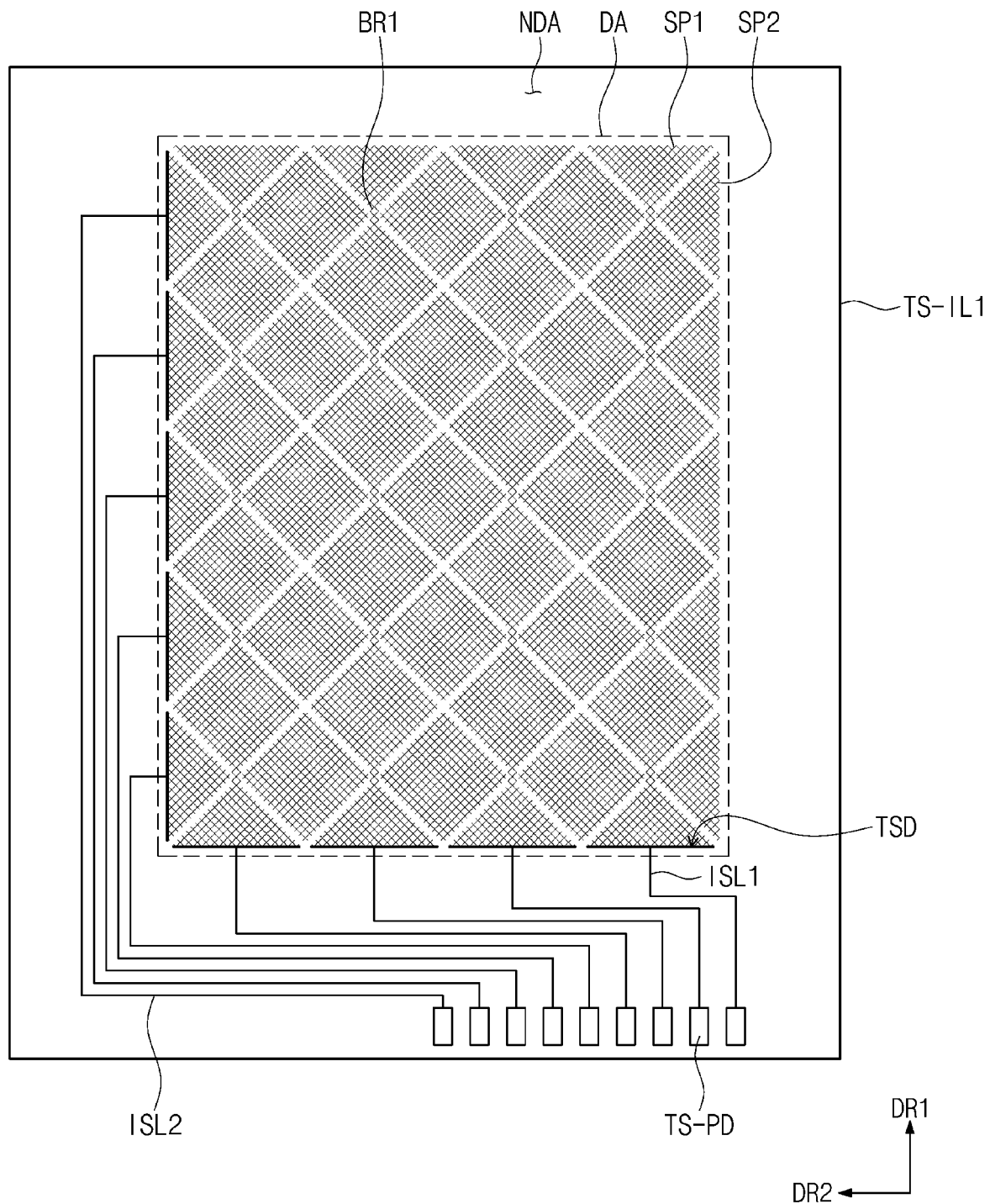

Referring to FIG. 9E, the second conductive pattern TS-CP2 may be disposed on the first touch insulating layer TS-IL1 and may include the first connecting portions BR1, the first input sensor units SP1 electrically connected to each other by the first connecting portions BR1, and the second input sensor units SP2 spaced apart from the first input sensor units SP1. As described above, the second input sensor units SP2 may be electrically connected to the first connecting portions BR1 of the second conductive pattern TS-CP2 through the contact hole CH defined in the first touch insulating layer TS-IL1.

Figure 9F:
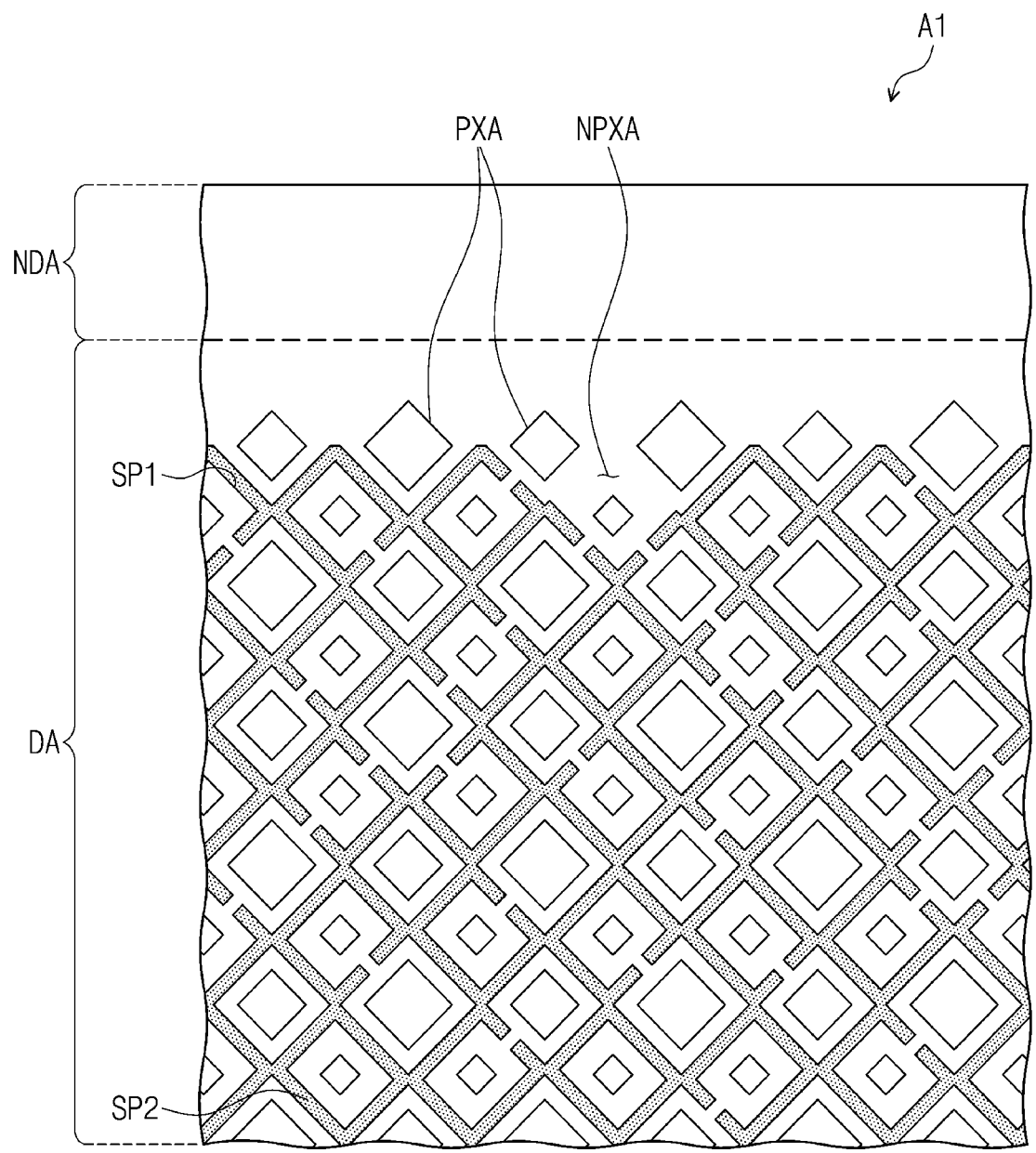
FIG. 9F is an enlarged view illustrating elements shown in FIG. 9B.
Figure 10:
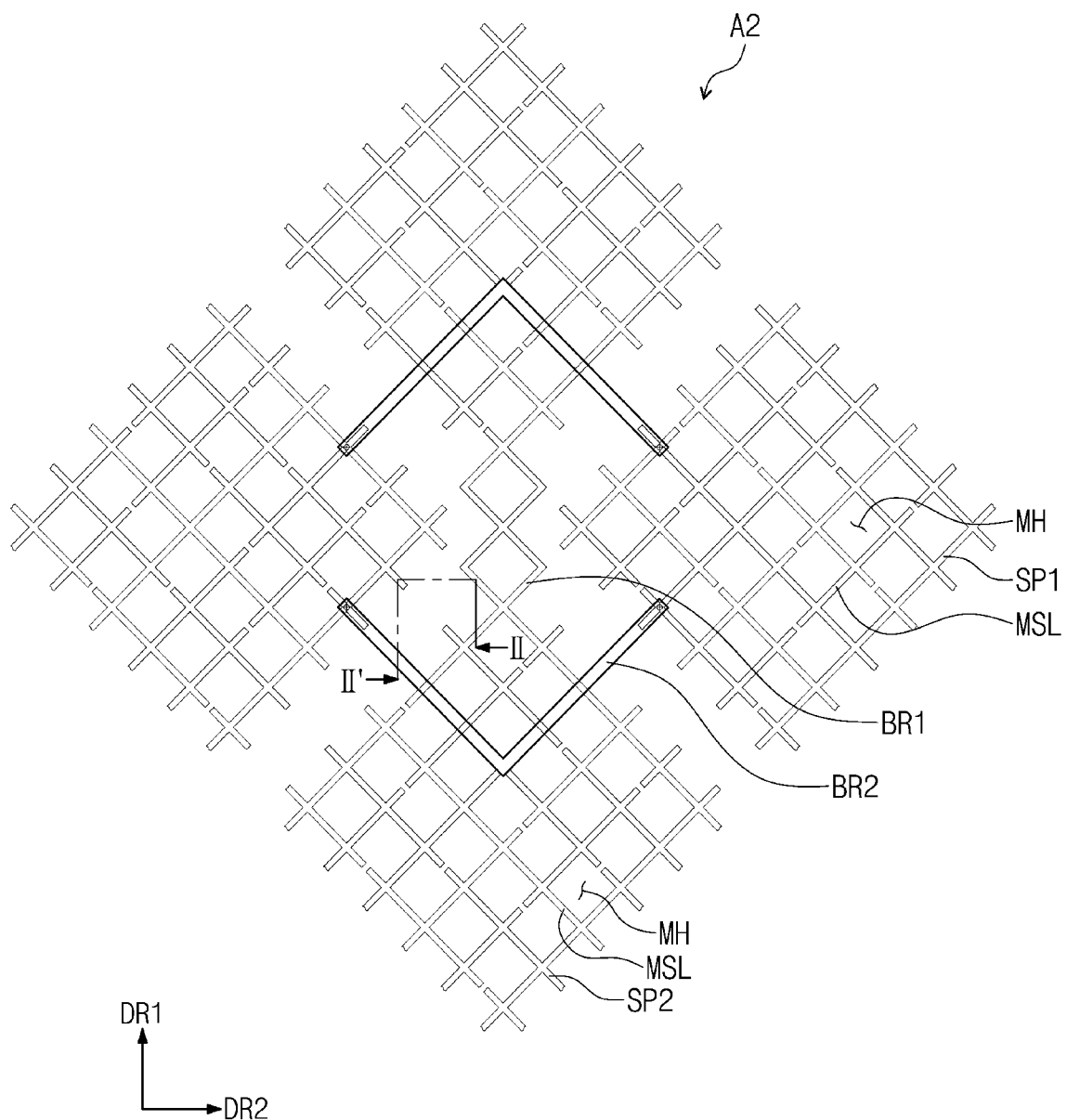
FIG. 10 is an enlarged view illustrating a region A2 of FIG. 9B.

FIG. 9F is an enlarged view of a region A1, illustrating some elements shown in FIG. 9B. FIG. 10 is an enlarged view illustrating a region A2 of FIG. 9B.

Referring to FIGS. 9F and 10, each of the first and second input sensor units SP1 and SP2 may include mesh lines MSL defining mesh holes MH. A line width of each of the mesh lines MSL may be several micrometers. Each of the first and second input sensor units SP1 and SP2 may have a mesh shape. Although not shown, the first and second input signal lines ISL1 and ISL2 may also have a mesh shape. Each of the first and second input sensor units SP1 and SP2 may overlap a non-light-emitting region NPXA.

When viewed in a plan view, the mesh holes MH may have at least two different areas. Although the mesh holes MH are illustrated to correspond to the light-emitting regions PXA in a one-to-one manner, the embodiments are not limited to this example. For example, each mesh hole MH may correspond to two or more light-emitting regions PXA. The areas of the light-emitting regions PXA may be variously changed, if necessary. In this regard, the mesh holes MH may have at least two different areas, when viewed in a plan view. For example, the light-emitting regions PXA may include a red light-emitting region, a green light-emitting region, and a blue light-emitting region, and the areas of the light-emitting regions PXA may be determined depending on their colors. However, the embodiments are not limited to this example. For example, the light-emitting regions PXA may have the same area and the mesh holes MH may also have the same area.

As shown in FIG. 10, the first connecting portions BR1 and the second connecting portions BR2 may be disposed to cross each other. The first connecting portions BR1 and the second connecting portions BR2 may be electrically disconnected from each other, with the first touch insulating layer TS-IL1 interposed therebetween, and may cross each other. However, the embodiments are not limited to this example.

As shown in FIG. 10, each of the first connecting portions BR1 and the second connecting portions BR2 may have a mesh shape. However, the invention is not limited to this example, and in an embodiment, the second connecting portions BR2 may not have the mesh shape.

In FIG. 10, adjacent first input sensor units SP1 are illustrated to be electrically connected to each other by two second connecting portions BR2, but the embodiments are not limited to this example. For example, adjacent ones of the first input sensor units SP1 may be electrically connected to each other by one second connecting portion BR2.

Figure 11:
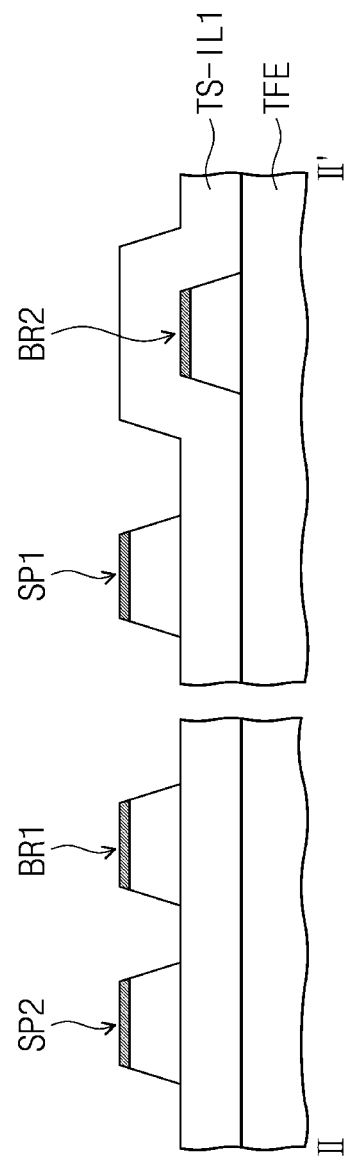
FIG. 11 is a schematic sectional view illustrating a vertical section taken along a line II-II' of FIG. 10.

FIG. 11 is a schematic sectional view illustrating a vertical section taken along a line II-II' of FIG. 10. In FIG. 11, the second connecting portion BR2 may correspond to the first conductive pattern TS-CP1 shown in FIG. 9A, and the first input sensor unit SP1, the first connecting portion BR1, and the second input sensor unit SP2 may correspond to the second conductive patterns TS-CP2.

Referring to FIGS. 9A and 11, the first conductive pattern TS-CP1 and the second conductive pattern TS-CP2 may have the same structure as the signal line SL or SL-1 described with reference to FIG. 2A or 2B. In other words, the first input signal lines ISL1, the second input signal lines ISL2, the first input sensing electrodes TE1, the second input sensing electrodes TE2, the first connecting portions BR1, and the second connecting portions BR2 may have the same structure as the signal line SL or SL-1 described with reference to FIG. 2A or 2B. The first input signal lines ISL1, the second input signal lines ISL2, the first input sensing electrodes TE1, the second input sensing electrodes TE2, the first connecting portions BR1, and the second connecting portions BR2 may each independently include the conductive layer CL (e.g., of FIG. 2A) and the capping layer CAP (e.g., of FIG. 2A) provided on the conductive layer CL. Reflectance of the input sensing unit TS may be lowered, and the input sensing unit TS may not be recognized by a user. Accordingly, the visibility of the display device DD may be improved.

FIGS. 9A and 11 illustrate examples, in which all of the first and second conductive pattern TS-CP1 and TS-CP2 have the same structure as the signal line SL or SL-1 described with reference to FIG. 2A or 2B, but in an embodiment, just one of the first and second conductive pattern CP1 and CP2 may have the same structure as the signal line SL or SL-1 of FIG. 2A or 2B.

FIGS. 9A to 11 illustrate examples, in which the input sensing unit TS has a double-layered structure. However, where the input sensing unit TS has a single-layered structure having one conductive layer, such a conductive layer may have the same structure as the signal line SL or SL-1 of FIG. 2A or 2B.

Figure 12A:
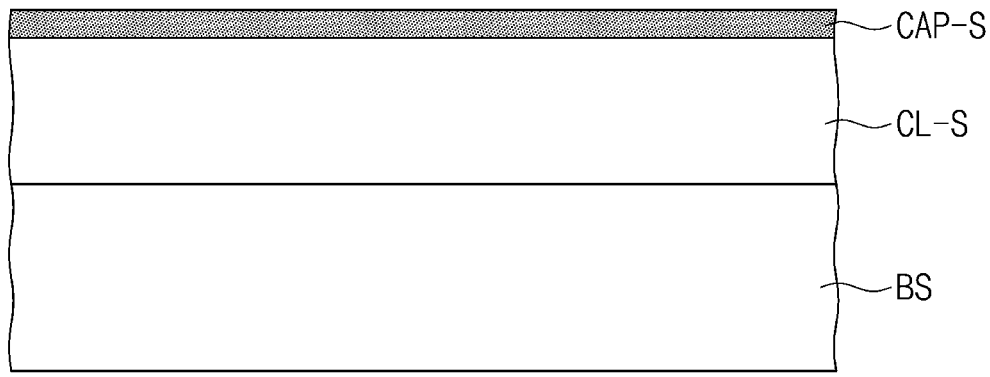
FIGS. 12A to 12C are schematic sectional views illustrating a method of forming a signal line according to an embodiment.
Figure 12B:
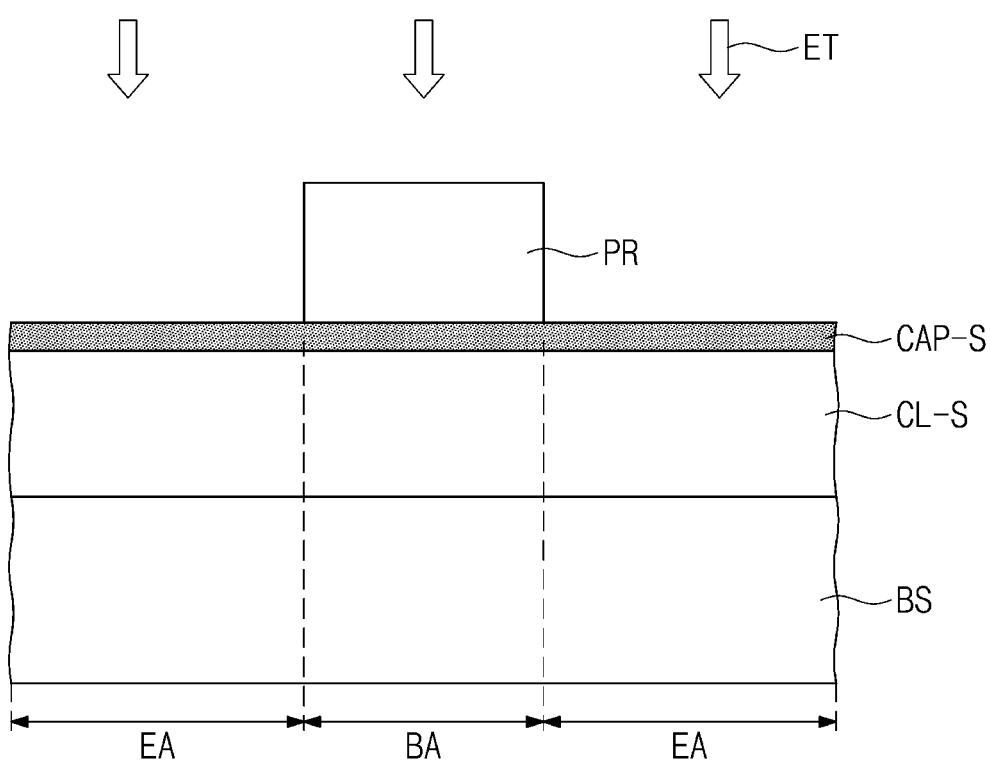
Figure 12C:
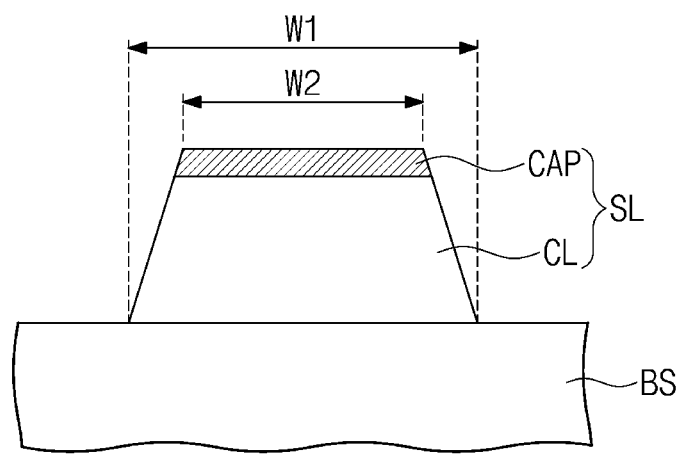

FIGS. 12A to 12C are schematic sectional views illustrating a method of forming a signal line according to an embodiment. For concise description, an element previously described with reference to FIGS. 2A and 2B may be identified by the same reference number.

Referring to FIG. 12A, a preliminary conductive layer CL-S and a preliminary capping layer CAP-S may be stacked (or sequentially stacked) on the first base layer BS1. The preliminary conductive layer CL-S may include the same material as the conductive layer CL, and the preliminary capping layer CAP-S may include the same material as the capping layer CAP. The preliminary conductive layer CL-S and the preliminary capping layer CAP-S may be formed through a deposition or coating process. In an embodiment, each of the preliminary conductive layer CL-S and the preliminary capping layer CAP-S may be formed by a sputtering process (e.g., a DC sputtering process). In an embodiment, the preliminary conductive layer CL-S and the preliminary capping layer CAP-S may be formed by processes, which may be sequentially and successively performed.

Referring to FIGS. 12B and 12C, the preliminary conductive layer CL-S and the preliminary capping layer CAP-S may be patterned to form some patterns. The patterns may correspond to the first gate lines G1 (e.g., of FIG. 7A). For example, the patterns may correspond to the second conductive patterns TS-CP2 (e.g., of FIG. 9A).

The preliminary conductive layer CL-S and the preliminary capping layer CAP-S may be patterned through an etching process. A photoresist pattern PR may be formed on the preliminary conductive layer CL-S and the preliminary capping layer CAP-S by a photolithography process, and an etching solution ET may be provided onto the structure with the photoresist pattern PR. Portions of the preliminary conductive layer CL-S and the preliminary capping layer CAP-S exposed by the photoresist pattern PR may be etched and removed by the etching solution ET.

The etching solution ET may be non-hydrogen-peroxide solution. For example, the etching solution ET may be non-hydrogen-peroxide solution containing phosphoric acid, nitric acid, and acetic acid. The preliminary conductive layer CL-S and the preliminary capping layer CAP-S may be formed of materials having reactivity with respect to the afore-described etching solution ET. However, the invention is not limited to this example, and in an embodiment, if an etching solution containing hydrogen peroxide can be used to effectively etch the preliminary conductive layer CL-S and the preliminary capping layer CAP-S, it may be chosen as the etching solution ET.

The preliminary conductive layer CL-S and the preliminary capping layer CAP-S may be etched in an order being exposed to the etching solution ET. Accordingly, the preliminary capping layer CAP-S and the preliminary conductive layer CL-S may be etched in an order enumerated.

When the content of zinc oxide in the preliminary capping layer CAP-S is less than about 70 at % and the preliminary conductive layer CL-S is formed of copper, the signal line SL may be etched in a properly adjusted etch rate and a tip portion may not be formed. Furthermore, when the preliminary capping layer CAP-S has a thickness equal to or less than about 1000 Å, the signal line SL may be formed without the formation of the tip portion. The tip portion may cause a localized damage to a layer (e.g., the first insulating layer of FIG. 7B and so forth), which is formed after the formation of the signal line SL. Thus, where the tip portion is formed, the layer formed in a subsequent process may be easily damaged by an external impact, and this may lead to deterioration in reliability of a process of fabricating the display device DD of FIG. 1.

By contrast, in a method of forming a signal line according to an embodiment, it may be possible to form a signal line without the formation of the tip portion, and thus, the display device DD (e.g., of FIG. 1) having a low reflectance property may be fabricated with high process reliability.

In an embodiment, the signal line may include a conductive layer and a capping layer, which is disposed (or directly disposed) on the conductive layer and contains vanadium nitride and zinc oxide. The signal line may have low reflectance to an external light, and thus, the signal line may make it possible to realize a display device with improved visibility.

According to an embodiment, a display device may include a signal line, which has low reflectance to an external light, and thus, visibility of the display device may be improved.

While embodiments have been particularly shown and described, it will be understood by one of ordinary skill in the art that variations in form and detail may be made therein without departing from the spirit and scope of the claims.

What is claimed is:

1. A display device, comprising:
   a base layer;
   a display element disposed on the base layer; and
   a signal line disposed on the base layer and electrically connected to the display element,
   wherein the signal line comprises:
      a conductive layer; and
      a capping layer disposed on the conductive layer and including vanadium nitride (VN) and zinc oxide (ZnO).

2. The display device of claim 1, wherein the capping layer further comprises aluminum oxide ($Al_2O_3$).

3. The display device of claim 2, wherein in the capping layer:
   a content of the vanadium nitride ranges from about 25 at % to about 80 at %,
   a content of the zinc oxide ranges from about 20 at % to about 70 at %, and
   a content of the aluminum oxide ranges from about 3 at % to about 10 at %.

4. The display device of claim 1, wherein reflectance of the capping layer is lower than reflectance of the conductive layer.

5. The display device of claim 1, wherein the capping layer is directly disposed on the conductive layer.

6. The display device of claim 1, wherein a mean reflectance of the signal line to visible light is equal to or less than about 20%.

7. The display device of claim 1, wherein the signal line further comprises an intermediate layer disposed between the conductive layer and the capping layer, and
   wherein the intermediate layer has a refractive index between a refractive index of the conductive layer and a refractive index of the capping layer.

8. The display device of claim 7, wherein the intermediate layer comprises at least one selected from the group consisting of silicon oxide, silicon nitride, silicon oxynitride, titanium oxide, and aluminum oxide.

9. The display device of claim 1, wherein a thickness of the capping layer ranges from about 200 Å to about 1000 Å.

10. The display device of claim 1, further comprising a thin film transistor disposed on the base layer, wherein,
    the display element is electrically connected to the thin film transistor, and
    the signal line comprises:
       a first signal line disposed on the base layer, and
       a second signal line crossing the first signal line and electrically disconnected from the first signal line.

11. The display device of claim 10, wherein the thin film transistor comprises:
    a semiconductor pattern disposed on the base layer;
    a control electrode that overlaps the semiconductor pattern when viewed in a plan view, wherein the control electrode and the first signal line are disposed on a same layer; and
    an input electrode and an output electrode that are electrically connected to the semiconductor pattern, wherein the input electrode, the output electrode, and the second signal line are disposed on a same layer;
    wherein each of the control electrode, the input electrode, and the output electrode comprises:
    the conductive layer; and
    the capping layer disposed on the conductive layer.

12. The display device of claim 11, wherein the display element is a liquid crystal display element.

13. The display device of claim 1, further comprising an input sensing unit disposed on the display element, the input sensing unit including:
    an input sensing electrode; and
    an input sensing line, wherein each of the input sensing electrode and the input sensing line comprises:
       the conductive layer; and the capping layer disposed on the conductive layer and including vanadium nitride (VN) and zinc oxide (ZnO).

14. The display device of claim 13, wherein the display element comprises an organic light emitting display element comprising an organic light emitting material or a quantum dot light emitting material.

15. The display device of claim 1, wherein the conductive layer comprises copper.

16. A display device, comprising:
a first signal line; and
a second signal line spaced apart from the first signal line, wherein at least one of the first signal line and the second signal line comprises:
a conductive layer; and
a capping layer disposed on the conductive layer and including vanadium nitride (VN) and zinc oxide (ZnO).

17. The display device of claim 16, wherein the capping layer further comprises aluminum oxide ($Al_2O_3$).

18. The display device of claim 17, wherein in the capping layer:
a content of the vanadium nitride ranges from about 25 at % to about 80 at %,
a content of the zinc oxide ranges from about 20 at % to about 70 at %, and
a content of the aluminum oxide ranges from about 3 at % to about 10 at %.

19. The display device of claim 16, wherein a thickness of the capping layer ranges from about 200 Å to about 1500 Å.

20. The display device of claim 16, wherein a mean reflectance of the capping layer to visible light is equal to or less than about 25%.

* * * * *